(12) United States Patent
Ozeki

(10) Patent No.: US 6,285,606 B1
(45) Date of Patent: Sep. 4, 2001

(54) SEMICONDUCTOR MEMORY DEVICE

(75) Inventor: Seiji Ozeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/621,705

(22) Filed: Jul. 24, 2000

(30) Foreign Application Priority Data

Jul. 23, 1999 (JP) .................................................. 11-209043

(51) Int. Cl.[7] .................................................... G11C 7/00
(52) U.S. Cl. ............... 365/200; 365/230.06; 365/230.08; 365/233; 365/225.7
(58) Field of Search ..................................... 365/200, 201, 365/203, 230.06, 230.08, 233, 225.7

(56) References Cited

U.S. PATENT DOCUMENTS 6,191,984 * 2/2001 Noh ....................................... 365/200

FOREIGN PATENT DOCUMENTS

407037398A * 2/1995 (JP) ............................... G11C/29/00

* cited by examiner

Primary Examiner—David Nelms
Assistant Examiner—David Lam
(74) Attorney, Agent, or Firm—Darryl G. Walker

(57) ABSTRACT

According to one embodiment, a semiconductor memory device can generate a decoder enable signal (YREDB) that can enable and disable a decoder circuit according to external address signals such that the decoder circuit is enabled when ordinary memory cells are accessed and disabled when redundant memory cells are accessed. The semiconductor memory device may include redundancy circuits (010) that may be placed in a first state when an ordinary memory cell is accessed and in a second state when a redundant memory cell is accessed. A combining circuit can activate the decoder enable signal (YREDB) when the redundancy circuits (010) are in the first state and deactivate the decoder enable signal (YREDB) when the redundancy circuits (010) are in the second state. In addition, a pulse generator (011) can provide an ordinary mode pulse (YRDB) in synchronism with all external clock. An ordinary mode pulse (YRDB) can activate the decoder enable signal (YREDB) when access is switched from a redundant memory cell to an ordinary memory cell.

13 Claims, 16 Drawing Sheets

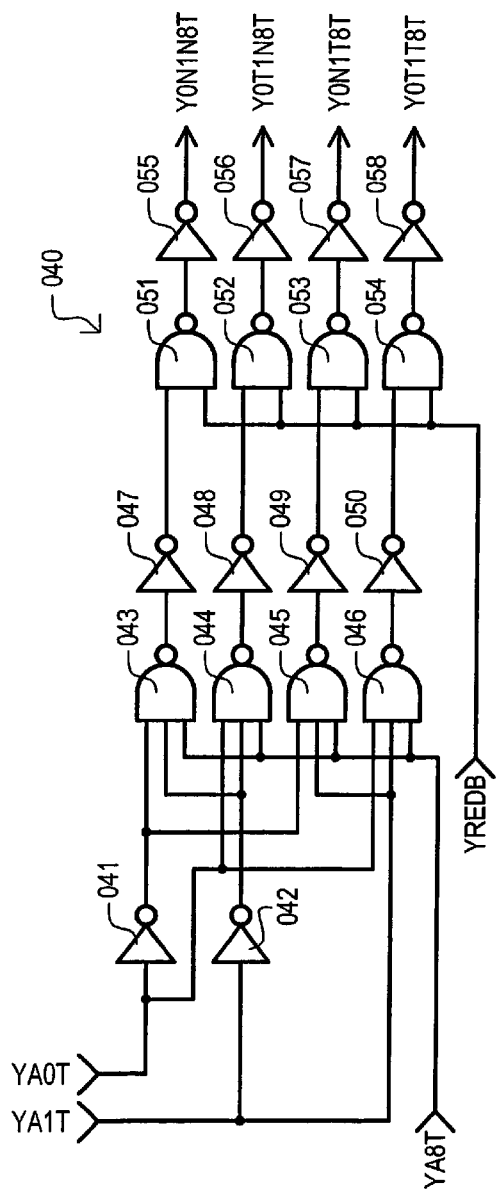
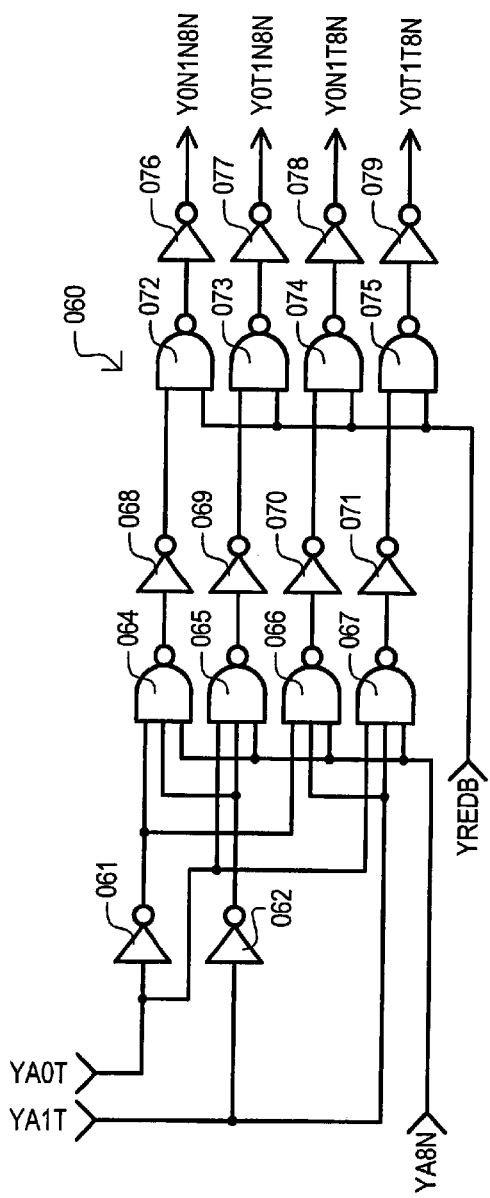
FIG. 2
FIG. 3

| CLK TRANSITION (ACCESS START) | TIME (nS) FROM CLK TRANSITION EMBODIMENT | TIME (nS) FROM CLK TRANSITION CONVENTIONAL |
|---|---|---|
| YRD TRANS. | 4.1 | 4.1 |
| FUSE NODE | 5.1 | 5.1 |
| YREDB TRANS. | 5.4 | 6.8 |
| YSW TRANS. | 7.1 | 8.5 |
| PIO TRANS. | 7.9 | 7.9 —CORR.→ 9.3 |
| RWBS TRANS. | 9.8 | ?? —CORR.→ 11.2 |
| OUTT/N TRANS. | 11.0 | ?? —CORR.→ 12.4 |
| DQ | 12.1 | 13.5 |
| tAA | 12.1 | 13.5 |

FIG. 13

SEMICONDUCTOR MEMORY DEVICE

TECHNICAL FIELD

The present invention relates generally to semiconductor memory devices, and more particularly to redundancy circuits for synchronous semiconductor memory devices.

BACKGROUND OF THE INVENTION

The storage capacity of semiconductor memory devices has continued to increase at a remarkable rate. The increase in storage capacity can be attributable to a number of factors, including but not limited to, advancements in processing technology and/or reductions in the size of various features within a semiconductor memory device. Reduced features sizes include smaller spacings between repeated structures (smaller "pitch"), as well as reductions in the size of particular components, such as conductive line widths, transistors, capacitors, and the like.

Due to the great number of memory cells and high complexity of most semiconductor memory devices, it can be very difficult to consistently manufacture devices that are completely free of defects. If all semiconductor devices having any sort of defect were completely discarded, the manufacturing yield of such devices would be significantly lowered. In order to increase fabrication yield, most semiconductor devices include some sort of redundancy scheme.

A redundancy circuit typically replaces one circuit element (such as a defective "ordinary" memory cell) with another (such as a redundant memory cell). In operation, when an address is applied to a memory device that corresponds to a defective ordinary memory cell, a redundancy circuit can detect such an address and prevent the defective ordinary memory cell from being accessed. Instead, the redundancy circuit can provide access to a redundant memory cell. In order to maintain operating speeds, it is desirable for an access to a redundant memory cell to be indistinguishable from an access to an ordinary memory cell and vice versa.

In this way, even if a semiconductor memory device includes defective memory cells (due to uncontrollable process variation, for example) it can still be fully functional through the use of redundancy circuits. This can allow semiconductor memory devices with defective memory cells to be packaged and provided as working devices. Consequently, the overall fabrication yield can be increased.

In many cases, even in the most advanced manufacturing processes, increases in semiconductor memory capacity may result in corresponding increases in defects. Thus, as semiconductor memory devices continue to increase in capacity, more and more redundant memory cells are included to account for possible defects. The resulting increases in redundancy circuits arising from larger numbers of memory cells may adversely affect access times to the semiconductor memory device.

To better understand the various features and advantages of the present invention, a conventional semiconductor memory device with redundancy circuits will now be described. A conventional semiconductor memory device is shown in FIG. 21, and may be a synchronous semiconductor memory. As shown in FIG. 21, a semiconductor device may include ordinary memory cell areas 001, a redundant memory cell area 002, Y decoder circuits 003, a redundancy Y switching circuit 004, Y predecoder circuits 005, and a redundancy circuit section 006.

Y decoder circuits 003 and redundancy switching circuit 004 may be situated in close proximity to cell areas 001 and 002. Y predecoder circuits 005 and redundancy circuit section 006 may be situated in the periphery of cell areas (001 and 002), but likewise are in close proximity to such areas.

Y decoder and Y predecoder circuits (003 and 005) can be provided to access ordinary memory cells in ordinary memory cell areas 001. As but one example, Y predecoder circuits 005 may receive address signals, and generate predecoded address signals. Such predecoded address signals may be received by Y decoder circuits 003 that may then select one or more ordinary memory cells.

Redundancy circuit section 006 and redundancy Y switching circuit 004 can be provided to access redundant memory cells in redundant memory cell area 002. More particularly, redundancy circuit section and redundancy switching circuit (006 and 004) may receive address values and determine if an address value corresponds to a defective ordinary memory cell. If an address value does not correspond to a defective memory cell, an access can proceed as described above with respect to Y decoder and Y predecoder circuits (003 and 005). If an address corresponds to a defective ordinary memory cell, redundancy circuit section and redundancy switching circuit (006 and 004) can disable a Y predecoder circuit 005 and select one or more redundant memory cells from a redundant memory cell area 002.

Referring now to FIG. 22, a diagram is set forth showing various signals that may be applied and generated in the conventional memory device of FIG. 21. To that extent, like structures will be referred to by the same reference characters.

As shown in FIG. 22, an address signal YAjT may be received. In the particular example illustrated, within the term "YAjT" a value j may be a positive integer and the value T may indicate a logic high level.

Various signals are generated depending upon to whether or not the address signal YAjT corresponds to a defective ordinary memory cell.

If an address signal YAjT does not correspond to a defective ordinary memory cell, a redundancy circuit section 006 can receive the address and determine that it does not correspond to a defective memory cell. Consequently, decode enable signal YREDB can remain active and redundancy Y switching activation signals RYS can remain inactive. With decode enable signals YREDB active, Y predecoder circuits 005 can predecode address signal YAjT and provide predecoded address signal YPRD to Y decoder circuits 003. According to predecoded address signals YPRD, Y decoder circuits 003 can access one or more ordinary memory cells (e.g., for a read or write operation) with Y select signals YSW. With redundancy switching activation signals RYS inactive, redundant memory cells in a redundant memory cell area 002 are not accessed.

If an address signal YAjT corresponds to a defective ordinary memory cell, a redundancy circuit section 006 can receive the address and determine such a correspondence. Consequently, decode enable signals YREDB can be deactivated and redundancy Y switching activation signals RYS can be activated. With decode enable signal YREDB inactive, Y predecoder circuits 005 can be disabled, and so do not generate predecoded address signal YPRD for Y decoder circuits 003. Thus, an ordinary memory cell is not accessed in response to an address signal YAjT. Instead, with redundancy Y switching activation signals RYS active, a redundancy switch circuit 004 can access one or more redundant memory cells according to redundancy Y select signals RYSW. In this way, a defective ordinary memory cell may be replaced by a redundant memory cell.

The operation of a redundancy circuit section 006 may be timed according to a clock synchronization signal YRD. A clock synchronization signal YRD may be a synchronous with an externally applied clock signal.

Various signals described with reference to FIG. 22 will now be described in more detail in FIG. 23. FIG. 23 is a representation of an integrated circuit "chip" that may include a conventional semiconductor memory device. As noted above, such a semiconductor memory device may be a synchronous device. In such a case, the synchronous semiconductor memory device may receive an external clock signal. Further, input signals may be received and output signals may be provided in synchronism with such an external clock signal.

In response to an external clock signal, a synchronous semiconductor memory device may generate an internal clock signal, shown as ICLK. An internal clock signal ICLK may be used to generate an address signal YAjT and a clock synchronization signal YRD. More particularly, a synchronous semiconductor memory device may include a clock synchronization signal generator 007 and a Y address signal generator 008. A Y address signal generator 008 can latch an externally applied address in synchronism with internal clock ICLK and provide an address signal YAjT. In addition, a clock synchronization signal generator 007 can generate a clock synchronization signal YRD in synchronism with an internal clock ICLK.

Having described the structure and operation of a conventional semiconductor memory device, an example of a conventional redundancy circuit section will now be described with reference to FIG. 24. The redundancy circuit section of FIG. 24 may be used in the previously described conventional semiconductor memory devices, and so is designated by the same reference character 006.

Referring now to FIG. 24, a redundancy circuit section 006 may include a number of redundancy circuits 009. Each redundancy circuit 009 may include a fuse node (FUSE 00–11). A fuse node (FUSE NODE 00–11) may be precharged to a high level, and then discharged if a received address value matches a defective address value programmed within the redundancy circuit 009. The redundancy circuit 009 for FUSE NODE 00 is shown in detail. The other redundancy circuits 009 (i.e., for FUSE NODES 01 to 11) may have the same configuration.

A redundancy circuit 009 may include a precharge device 020, an enable device 021, fuses 022 and corresponding detect transistors 023. In addition for each fuse 022 and detect transistor 023, there may be a complementary fuse 024 and complementary detect transistor 025. A precharge device 020 may be a p-channel transistor having a source-drain path between FUSE NODE 00 and a first power supply and a gate that receives a clock synchronization signal YRD. An enable device 021 may be an n-channel transistor having a source-drain path between FUSE NODE 00 and a second power supply (e.g., ground) and a gate that receives an enable signal ø. A fuse 022 may be arranged in series with the source-drain path of a detect transistor 023 between FUSE NODE 00 and the second power supply. A fuse 022 may be programmed (e.g., opened or kept intact) to store part of a defective address and a detect transistor 023 may be an n-channel transistor. In a similar fashion, a complementary fuse 024 may be arranged in series with the source-drain path of a complementary detect transistor 025 between FUSE NODE 00 and the second power supply. A complementary fuse 024 may also be programmed to store part of a defective address and a complementary detect transistor 025 may be an n-channel transistor.

As noted above, a redundancy circuit 009 may receive an address signal. Such an address signal is shown in FIG. 24 as address values YA0T to YA8T. As shown in the figure, address values (YA0T to YA8T) may be applied to the gates of detect transistors 023. Further, address values (YA0T to YA8T) may be inverted by inverters 026 and then provided to the gates of complementary detect transistors 025.

A redundancy circuit 009 may also include a latching circuit. A latching circuit can latch NODE 00 at a precharged value, and in addition, provide a redundancy Y activating signal RYS0. Such a latching circuit may include series connected inverters 027 and 028, as well as feedback transistor 029. The output of inverter 027 can provide a signal RYB.

Having described the various circuit components of a redundancy circuit 009, the operation of the redundancy circuit 009 will now be described. Prior to an access, a clock synchronization signal YRD may be low, while an enable signal ø may be also be low. Precharge device 020 can be turned on while enable device 021 can be turned off, and FUSE NODE 00 can be precharged to a first power supply level. With FUSE NODE 00 high, inverter 027 can turn on feedback transistor 029 thereby latching FUSE NODE 00 at the high level.

Next, clock synchronization signal YRD can transition high, and address values (YA0T to YA8T) can be applied to the redundancy circuit 009. Feedback transistor 029 can maintain FUSE NODE 00 at the precharged high level. The response of the redundancy circuit 009 can vary according to whether applied address values (YA0T to YA8T) match a defective address stored by fuses 022 and complementary fuses 023.

If the applied address values (YA0T to YA8T) do not match a defective address, FUSE NODE 00 can be discharged by at least one detect transistor 023 or complementary detect transistor 025 being turned on and overpowering feedback transistor 029. The discharging of FUSE NODE 00 can also result in the deactivation of redundancy Y activating signal RYS0.

If the applied address values (YA0T to YA8T) match a defective address, the particular state of fuses 022 and complementary fuses 024 can prevent FUSE NODE 00 from discharging, and FUSE NODE 00 can remain latched at the precharged high level. Further, redundancy Y activating signal RYS0 can remain activated.

A redundancy circuit section 006 may further include combining logic that can detect if a programmed defective address is detected by any of the redundancy circuits 009. If a defective address is not detected (i.e., an applied address corresponds to an ordinary memory cell) a decode enable signal YREDB can remain active. If, however, a defective address is not detected (i.e., an applied address corresponds to a defective ordinary memory cell) decode enable signal YREDB can be deactivated.

The combining logic of FIG. 24 includes NOR gates 030 and 031. Each NOR gate (030 and 031) may logically combine the state of two fuse nodes. Thus, if either FUSE NODE 00 or 01 is high, the output of NOR gate 030 YREB0 will be driven low. Similarly, if either FUSE NODE 10 or 11 is high, the output of NOR gate 031 YREB1 will be driven low. The outputs of NOR gates (030 and 031) may be logically combined in a NAND gate 032. Further, the output of NAND gate 032 YRE0 and the outputs (YER1 YER2) other such NAND gates (not shown) may be logically combined in a NOR gate 033. The output of NOR gate 033 may be a decode enable signal YREDB.

In the conventional example of FIG. 24, access to memory cells (both redundant and ordinary) can depend upon the level of decode enable signal YREDB. Thus, when access switches from an ordinary memory cell to a redundant memory cell, YREDB can transition from high to low and redundant Y select signals (RYSW) can be activated. Similarly, when access switches from a redundant memory cell to an ordinary memory cell, YREDB can transition from low to high and Y select signals RYSW can be activated.

As noted above, because semiconductor memory device capacity has been increasing. such devices have a larger number of redundant memory cells. Consequently, semiconductor memory devices can have larger areas, more logic stages and larger fuse nodes. Further, wiring loads, in particular the wiring load for decode enable signals YREDB call also be larger. For these and other reasons, the delay involved in switching between ordinary and redundant memory cell accesses can be considerable.

Such delays can adversely affect the operation of a semiconductor memory device: Access times can increase, or, in a worst case situation, erroneous data may result.

In light of the above drawbacks to conventional semiconductor memory devices, it would be desirable to arrive at some way of reducing delays associated with switching between a redundant memory cell access and ordinary memory cell access.

SUMMARY OF THE INVENTION

According to one embodiment of the present invention, a semiconductor memory device can generate a decode enable signal. When an ordinary memory cell is accessed, a decode enable signal is active, enabling the decoder circuit. When a redundant memory cell is accessed, a decode enable signal is inactive, disabling the decoder circuit. In addition, when switching access from a redundant memory cell to an ordinary memory cell, the decode enable signal can be activated in synchronism with an external clock signal. Address signals for accessing ordinary and redundant memory cells can be received in synchronism with the external clock signal.

According to one aspect of the embodiments a decoder circuit may include a predecoder that prevents address signals from being applied to other decoder circuits when the decode enable signal is inactive.

According to another aspect of the embodiments, a semiconductor memory device may include a number of state retaining circuits and a combining circuit. A state retaining circuits call be in a first state when an ordinary memory cell is accessed and a second state when a redundant memory cell is accessed. The combining circuit can activate the decode enable signal when all of the state retaining circuits are in the first state, and deactivate the decode enable signal when at least one of the state retaining circuits is in the second state.

A combining circuit may include first level circuits that can logically combine the states of multiple state retaining circuits and second level circuits that can logically combine the outputs of first level circuits with an ordinary mode signal. An ordinary mode signal may be generated in synchronism with an external clock signal. According to particular aspects of the embodiments, first level circuits may include NOR gates and second level circuits may include an AND-NOR logic circuit. In addition, or alternatively, an ordinary mode signal may be a pulse that is generated by a pulse generator circuit.

According to one aspect of the embodiments, a pulse generator may include a logic circuit having one input that receives an internal signal and another input that receives a delayed internal signal. According to particular aspects of the embodiments, a pulse generator may include a NOR gate having one input that receives a clock synchronization signal at one input directly, and another input that receives the clock synchronization signal by way of an inverting delay circuit.

According to another embodiment, a semiconductor memory device may activate a decode enable signal when an ordinary memory cell is accessed and deactivate the decode enable signal when a redundant memory cell is accessed. A decoder circuit that accesses ordinary memory cells can be enabled and disabled according to the decode enable signal. A semiconductor memory device may further include redundancy circuits with fuse nodes that can be at a first state when an applied address corresponds to an ordinary memory cell and a second state when the address corresponds to a redundant memory cell. A combining circuit can receive fuse node states and activate the decode enable signal when all the fuse nodes are at the first state and deactivate the decode enable signal when at least one of the fuse nodes is at the second state. Further, when access is switched from a redundant memory cell to an ordinary memory cell, the decode enable signal can be activated in synchronization with an external clock signal.

According to one aspect of the embodiments, each decoder circuit may include detect transistors having source-drain paths arranged in series with fuses between the fuse node and a first power supply. A precharge transistor may also be included that has a source-drain path arranged in series between the fuse node and a second power supply.

According to another aspect of the embodiments, a combining logic circuit may include first level NOR gates that logically combine the states of at least two redundancy circuit fuse nodes. A second level AND gate may then combine at least two outputs of first level NOR gates. A second level NOR gate can combine the outputs of at least one second level AND gate with an ordinary mode signal generated in synchronization with the external clock signal.

BRIEF DESCRIPTION OF THE DRAWINGS

FIG. 2 is a circuit diagram of a first predecoder circuit according to one embodiment.

FIG. 3 is a circuit diagram of a second predecoder circuit according to one embodiment.

FIG. 13 is a table illustrating the differences between an access according to the present invention and that of a conventional approach.

DETAILED DESCRIPTION OF THE EMBODIMENTS

Figure 1:
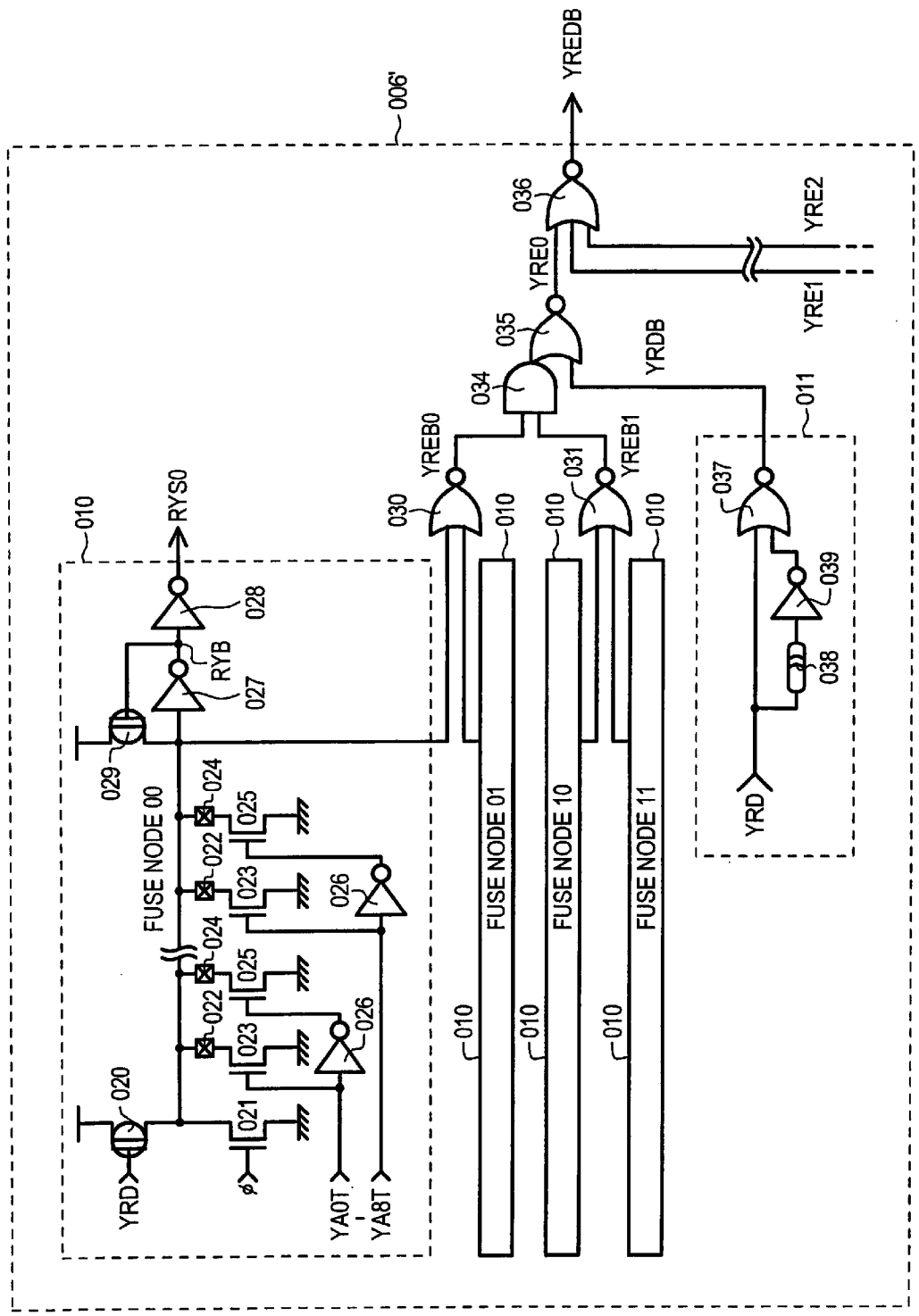
FIG. 1 is a circuit diagram showing a redundancy circuit section according to one embodiment.

Various embodiments according to the present invention will now be described with reference to a number of figures. FIGS. 1 to 20 show various embodiments of the present invention, and may include some of the same structures described in conjunction with FIGS. 21 to 24. To that extent, like structures will be referred to by the same reference character.

Figure 21:
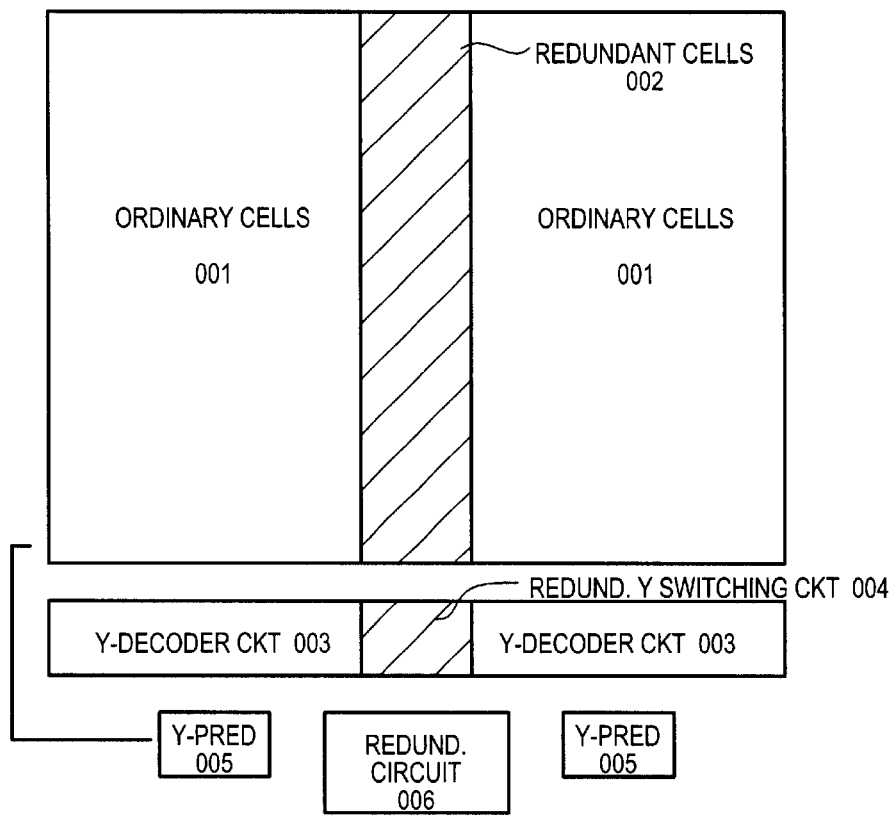
FIG. 21 is a block diagram showing a conventional semiconductor memory device.
Figure 22:
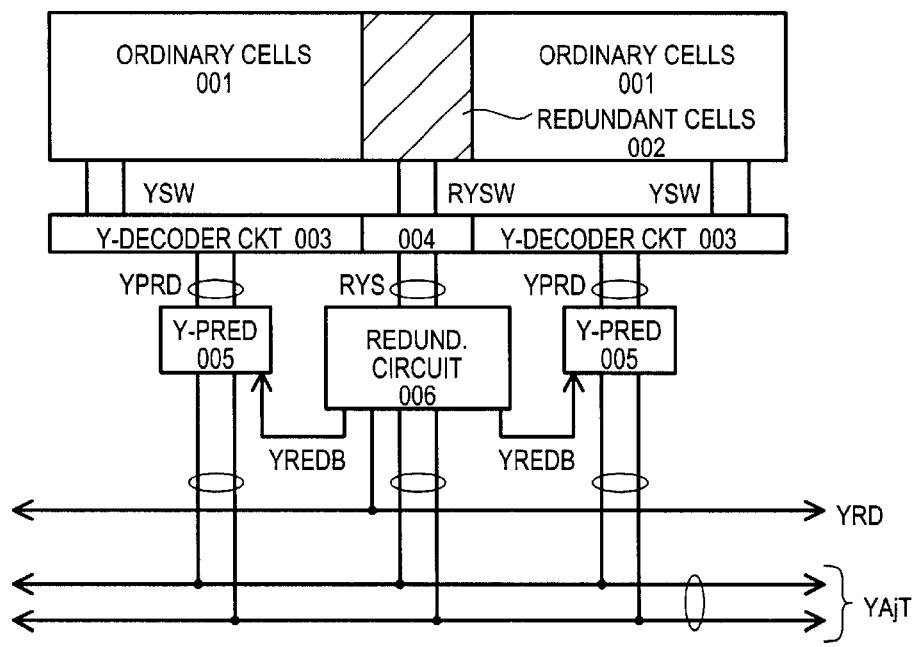
FIG. 22 is a diagram showing various signals that may be applied and generated in the conventional semiconductor memory device of FIG. 21.
Figure 23:
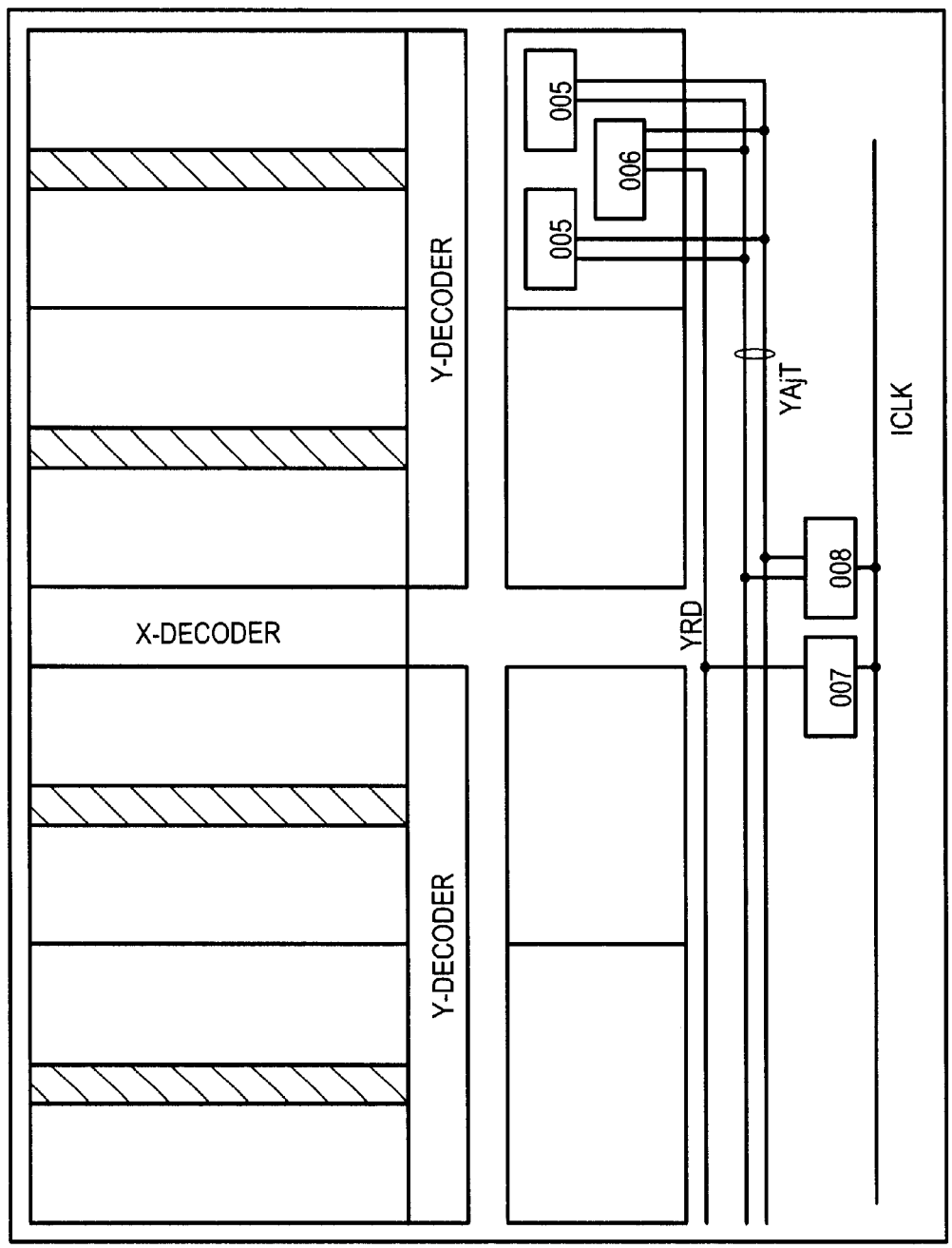
FIG. 23 is another diagram showing various signals that may be applied and generated in the conventional semiconductor memory device of FIG. 21.
Figure 24:
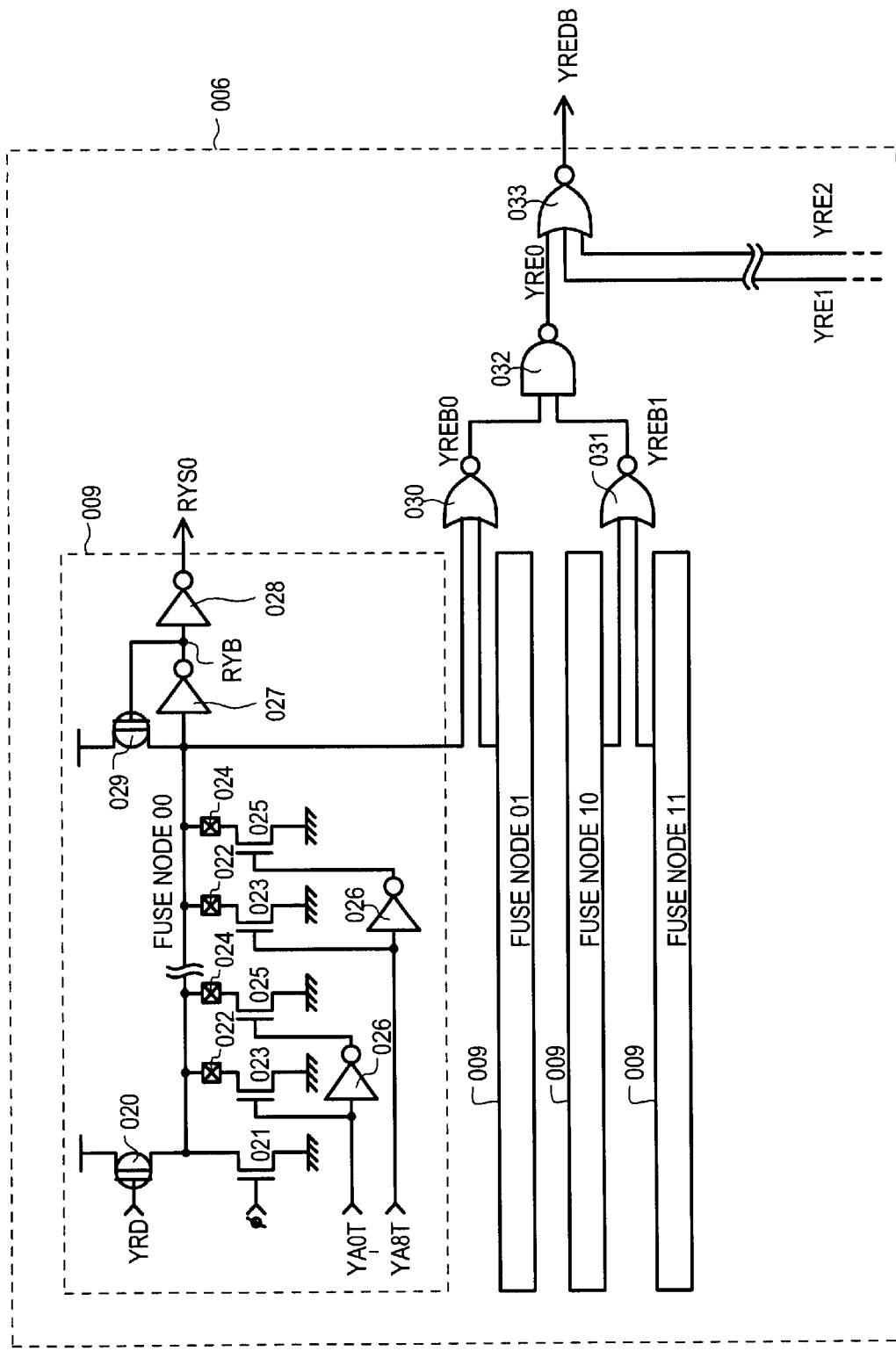
FIG. 24 is a circuit diagram showing a conventional redundancy circuit section.

A semiconductor memory device according to one embodiment may have the same general configuration as that shown in FIGS. 21 to 23. However, such an embodiment may include a redundancy circuit section 006' that differs from a conventional case. Accordingly, a redundancy circuit section 006' according to one embodiment will now be described in detail.

Referring now to FIG. 1, a redundancy circuit section 006' may include a number of redundancy circuits 010. Each redundancy circuit 010 may include a fuse node (FUSE 00–11). A fuse node (FUSE NODE 00–11) may be precharged to a high level, and then discharged if a received address value matches a defective address value programmed within the redundancy circuit 010. The redundancy circuit 010 for FUSE NODE 00 is showing in detail. The other redundancy circuits 010 (i.e., for FUSE NODES 01 to 11) may have the same configuration.

A redundancy circuit 010 may further include a precharge device 020, an enable device 021, fuses 022 and corresponding detect transistors 023. In addition, for each fuse 022 and detect transistor 023, there may be a corresponding complementary fuse 024 and complementary detect transistor 025. A precharge device 020 may be a p-channel transistor having a source-drain path between FUSE NODE 00 and a first power supply and a gate that receives a clock synchronization signal YRD. An enable device 021 may be an n-channel transistor having a source-drain path between FUSE NODE 00 and a second power supply (e.g., ground) and a gate that receives an enable signal ø.

A fuse 022 may be arranged in series with the source-drain path of a detect transistor 023 between FUSE NODE 00 and the second power supply. A fuse 022 may be programmed (e.g., opened or kept intact) to store part of a defective address and a detect transistor 023 may be an n-channel transistor. In a similar fashion, a complementary fuse 024 may be arranged in series with the source-drain path of a complementary detect transistor 025 between FUSE NODE 00 and the second power supply. A complementary fuse 024 may also be programmed to store part of a defective address and a complementary detect transistor 025 may be an n-channel transistor.

As noted above, a redundancy circuit 010 may receive an address signal. Such an address signal is shown in FIG. 1 as address values YA0T to YA8T. As shown in the figure, address values (YA0T to YA8T) may be applied to the gates of detect transistors 023. Further, address values (YA0T to YA8T) may be inverted by inverters 026 and then provided to the gates of complementary transistors 025.

A redundancy circuit 010 may also include a latching circuit. A latching circuit can latch NODE 00 at a precharged value, and in addition, provide a redundancy Y activating signal RYS0. Such a latching circuit may include series connected inverters 027 and 028, as well as feedback transistor 029. The output of inverter 027 can be a signal RYB.

Having described the various circuit components of a redundancy circuit 010, the operation of the redundancy circuit 010 will now be described. Redundancy circuits 010 may be conceptualized as holding particular states (e.g., charged or discharged). When a defective address is received (i.e., an address that will access a redundant memory cell) a redundancy circuit 010 may be in a one state (charged). In contrast, when an ordinary address is received (i.e., an address that will access an ordinary memory cell) a redundancy circuit 010 may be in another state (discharged).

Referring back to FIG. 1 prior to an access, a clock synchronization signal YRD may be low, while an enable signal o may be also be low. Precharge device 020 can be turned on while enable device 021 can be turned off, and FUSE NODE 00 can be precharged to a first power supply level. With FUSE NODE 00 high, inverter 027 can turn on feedback transistor 029 thereby latching FUSE NODE 00 at the high level. In this way, FUSE NODE 00 can be placed in a first state.

Next, clock synchronization signal YRD can transition high, and address values (YA0T to YA8T) can be applied to the redundancy circuit 010. Feedback transistor 029 can maintain FUSE NODE 00 at the precharged high level. The response of the redundancy circuit 010 can vary according to whether applied address values (YA0T to YA8T) match a defective address value stored by fuses 022 and complementary fuses 024.

If the applied address values (YA0T to YA8T) do not match a defective address, FUSE NODE 00 can be discharged by at least one detect transistor 023 or complementary detect transistor 025 being turned on and overpowering feedback transistor 029. The discharging of FUSE NODE 00 can also result in the deactivation of redundancy Y activating signal RYS0. In this way, FUSE NODE 00 can switch from a second state (e.g., charged) to a second (e.g., discharged).

If the applied address values (YA0T to YA8T) match a defective address, the particular state of fuses 022 and complementary fuses 024 can prevent FUSE NODE 00 from discharging, and FUSE NODE 00 can remain latched at the precharged high level. Further, redundancy Y activating signal RYS0 can remain activated. In this way, FUSE NODE 00 can be maintained at a first state.

A redundancy circuit section 006' may further include combining logic. Combining logic can provide an active decode enable signal YREDB when an applied address does not match any programmed defective addresses, and provide an inactive decode enable signal YREDB when an applied address matches a programmed defective address. In particular, if access changes from a redundant memory cell to an ordinary memory cell, decode enable signal YREDB can transition from inactive to active (low to high, for example).

The combining logic of FIG. 1 is shown to include first level logic circuits 030 and 031. In the particular example of FIG. 1, first level logic circuits can include NOR gates 030 and 031. First level logic circuits (030 and 031) may logically combine the values of multiple fuse nodes. In FIG. 1, each NOR gate (030 and 031) can logically combine two fuse node values. In particular, if either FUSE NODE 00 or 01 is high, the output of NOR gate 030 (YREB0) will be driven low. Similarly, if either FUSE NODE 10 or 11 is high, the output of NOR gate 031 (YREB1) will be driven low.

The various outputs (YREB0 and YREB1) of first level logic circuits (030 and 031) may be logically combined in a second level logic circuit (034 and 035). A second level logic circuit (034 and 035) may further receive an ordinary mode pulse YRDB. In such an arrangement, a redundant indication signal YRE0 may indicate a redundant/ordinary access according to outputs of first level logic circuits (YREB0 and YREB1) as well as the ordinary mode pulse YRDB.

More particularly, redundant indication signal YRE0 may indicate a redundant mode (be at a logic high) when one of the fuse nodes (FUSE 00 to 11) is high. In addition, a redundant indication signal YRE0 may indicate an ordinary mode (be at a logic low) when all the fuse nodes (FUSE 00 to 11) are low or if an ordinary mode pulse YRDB is high. This is in contrast to conventional approaches that may indicate an ordinary mode only when all of the fuse nodes (FUSE 00 to 11) are low.

The particular second level logic circuit of FIG. 1 is shown to include an AND-NOR circuit having an AND gate 034 that receives outputs from first level logic circuits (030 and 031) and a NOR gate 035 that receives the output of AND gate 034 and the ordinary mode pulse YRDB.

A redundancy circuit section 006' may also include a pulse generator 011 for generating an ordinary mode pulse YRDB. In FIG. 1, a pulse generator 011 can generate a pulse in response to a low-to-high transition in the clock synchronization signal YRD. A pulse generator 011 may particularly include a NOR gate 037 having one input that may receive the clock synchronization signal YRD directly, and another input that may receive the clock synchronization signal YRD by way of a non-inverting delay element 038 and an inverter 039.

As shown in FIG. 1, in addition to redundant indication signal YRE0, a third level logic circuit 036 can receive other redundant indication signals YRE1 and YRE2. It is understood that such other redundant indication signals (YRE1 and YRE2) can be generated in the same general fashion as redundant indication signal YRE0.

Having described a redundancy circuit section 006' according to one embodiment, a Y predecoder circuit will now be described with reference to FIGS. 2, 3, 4, and 5. In one particular embodiment, a Y predecoder circuit may be as item 005 as shown in FIGS. 21 to 23.

Figure 4:
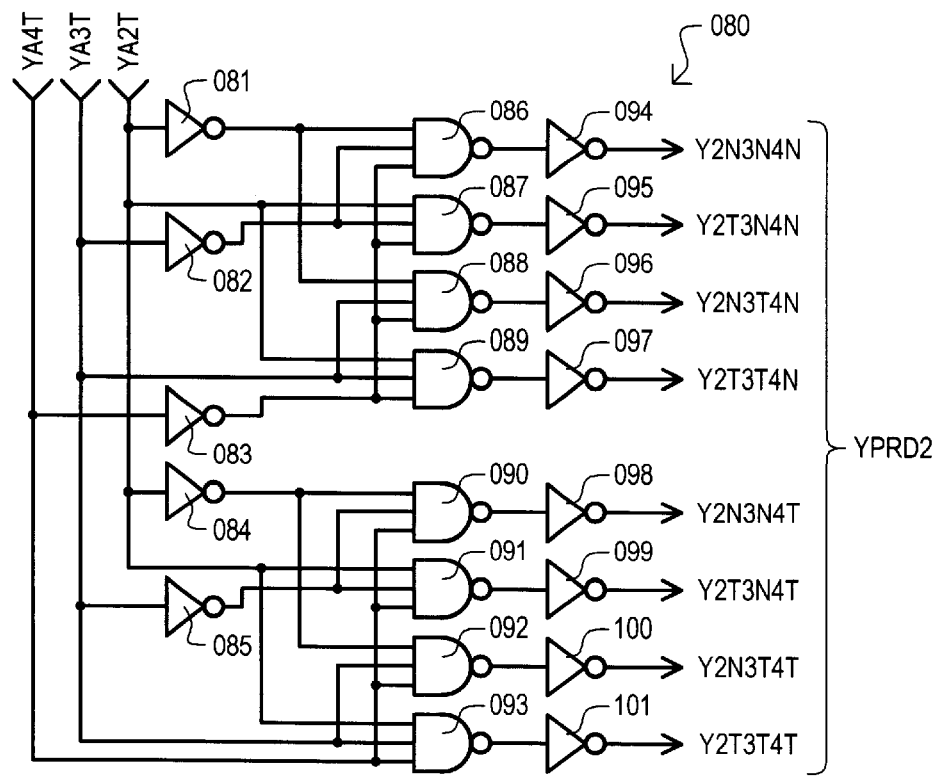
FIG. 4 is a circuit diagram of a third predecoder circuit according to one embodiment.
Figure 5:
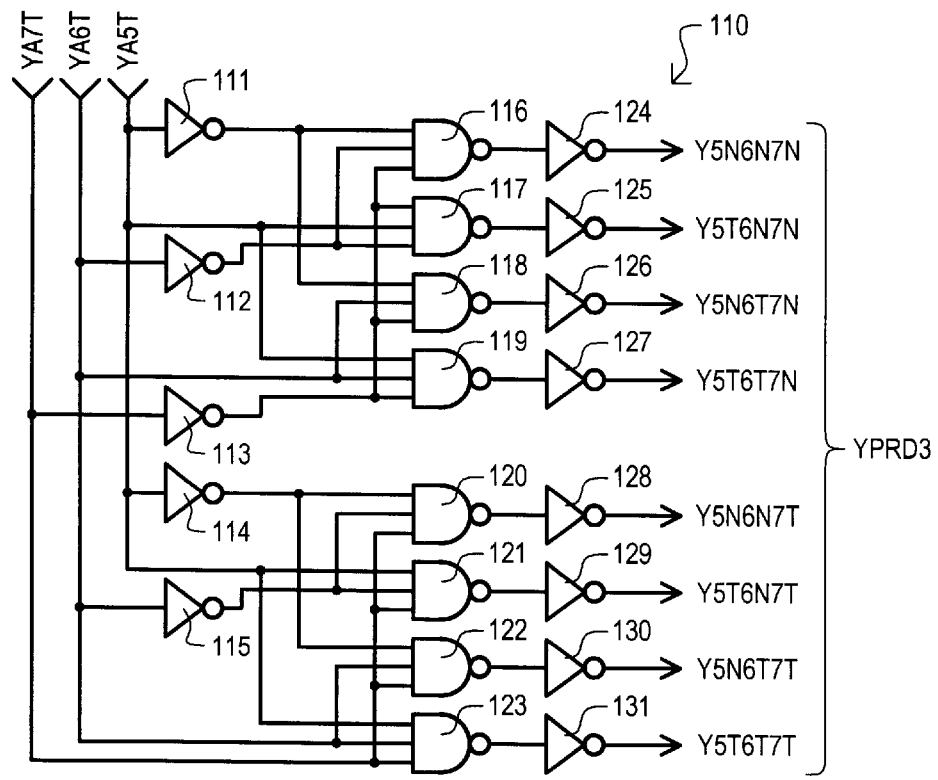
FIG. 5 is a circuit diagram of a fourth predecoder circuit according to one embodiment.

A Y predecoder circuit according to one embodiment may include a first predecoder circuit 040 as shown in FIG. 2, a second predecoder circuit 060 as shown in FIG. 3, a third predecoder circuit 080 as shown in FIG. 4, and a fourth predecoder circuit 110 as shown in FIG. 5.

Referring now to FIG. 2, a first predecoder circuit 040 is shown in a circuit diagram. A first predecoder circuit 040 may receive address signals YA0T, YA1T and YA8T to generate predecoded signals Y0N1N8T, Y0T1N8T, Y0N1T8T, and Y0T1T8T. Further, a first predecoder circuit 040 may be enabled and disabled according to a decode enable signal YREDB. The first predecoder circuit 040 may include signal inverters 041 and 042, decoding gates 043 to 046 result inverters 047 to 050, enable gates 051 to 054, and output inverters 055 to 058.

Signal inverters 041 and 042 can invert address signals YA0T and YA1T. Decoding gates (043 to 046) may include NAND gates that receive various combinations of address signals. In the particular example of FIG. 2, each NAND gate (043 to 046) may have one input that receives address value YA8T, another input that receives address value YA0T or its inverse, and a third input that receives address value YA1T or its inverse. In this way, provided address signal YA8T is high, the output of one decoding gate (043 to 046) can be activated (driven low in this case) in response to each particular combination of YA0T and YA1T. The outputs of decoding gates 043 to 046 may be inverted by result inverters 047 to 050, respectively.

The outputs of each result inverters 047 to 050 may be received by an enable gate 051 to 054. Each enable gate (051 to 054) may also receive a decode enable signal YREDB. In this arrangement, if a decode enable signal YREDB is active (high, in this case), an enable gate (051 to 054) can provide an output that follows its other input. Conversely, if the decode enable signal YREDB is inactive (low, in this case), all the enable gates (051 to 054) can provide the same output (high, in this case). The outputs of enable gates 051 to 054 may be inverted by output inverters 055 to 058, respectively.

Output inverters 055 to 058 may provide predecoded signals Y0N1N8T, Y0T1N8T, Y0N1T8T. and Y0T1T8T, respectively. It is noted that the identification of predecoded signals indicates what particular combination of signal values will result in the activation of the predecoded signal. For example, the signal Y0N1N8T can be activated when signal YA0T is low ("0N"), YA1T is low ("1N") and YA8T is high ("8T").

In this way, when a decode enable signal YREDB is active, one of the predecoded signals Y0N1N8T, Y0T1N8T, Y0N1T8T, and Y0T1T8T may be activated (driven high) according to particular address signal combinations. This can allow one or more ordinary memory cells to be selected. However, when a decode enable signal YREDB is inactive, all of the predecoded signals Y0N1N8T, Y0T1N8T, Y0N1T8T, and Y0T1T8T are inactive (driven low). This can prevent the selection of an ordinary memory cell.

Having described a first predecoder circuit 040 in conjunction with FIG. 2, a second predecoder circuit 060 will now be described with reference to FIG. 3.

Referring now to FIG. 3, a second predecoder circuit 060 may receive address signals YA0T, YA1T and YA8N to generate predecoded signals Y0N1N8N, Y0T1N8N, Y0N1T8N, and Y0T1T8N. If reference is made back to FIG. 2, an address signal YA8N can be the inverse of address signal YA8T. As in the case of the first predecoder circuit 040, a second predecoder circuit 060 may be enabled and disabled according to a decode enable signal YREDB. The second predecoder circuit 040 may include signal inverters 061 and 062, decoding gates 064 to 067, result inverters 068 to 071 enable gates 072 to 075, and output inverters 076 to 079.

Signal inverters 061 and 062 can invert address signals YA0T and YA1T, respectively. Decoding gates (064 to 067) may include NAND gates that receive various combinations of address signals. In the particular example of FIG. 3, each NAND gate (064 to 067) may have one input that receive the inverse of address value YA8N, another input that receives address value YA0T or its inverse, and a third input that receives address value YA1T or its inverse. In this way, provided address signal YA8N is low, the output of one decoding gate (064 to 067) can be activated (driven low in this case) in response to each particular combination of YA0T and YA1T. The outputs of decoding gates 064 to 067 may be inverted by result inverters 068 to 071, respectively.

The outputs of each result inverters 068 to 071 may be received by an enable gate 072 to 075. Each enable gate (072 to 075) may also receive a decode enable signal YREDB. In this arrangement, if a decode enable signal YREDB is active (high in this case), an enable gate (072 to 075) can provide an output that follows its other input. Conversely, if the decode enable signal YREDB is inactive (low in this case), all the enable gates (072 to 075) can provide the same output (high in this case). The outputs of enable gates 072 to 075 may be inverted by output inverters 076 to 079, respectively.

Output inverters 076 to 079 may provide predecoded signals Y0N1N8N, Y0T1N8N, Y0N1T8N, and Y0T1T8N, respectively. It is noted the identification of predecoded signals indicates what particular combination of signal values will result in activation of the predecoded signal. For example, the signal Y0N1N8N can be activated when signal YA0T is low ("0N"), YA1T is low ("1N") and YA8N is high ("8N").

In this way, when a decode enable signal YREDB is active, one of the predecoded signals Y0N1N8N, Y0T1N8N, Y0N1T8N, and Y0T1T8N may be activated (driven high) according to particular address signal combinations. This can allow one or more ordinary memory cells to be selected. However, when a decode enable signal YREDB is inactive, all of the predecoded signals Y0N1N8N, Y0T1N8N, Y0N1T8N, and Y0T1T8N are inactive (driven low). This can prevent the selection of an ordinary memory cell.

Having described a first and second predecoder circuits (040 and 060) in conjunction with FIGS. 2 and 3, a third predecoder circuit 080 will now be described with reference to FIG. 4.

Referring now to FIG. 4, a third predecoder circuit 080 may receive address signals YA2T, YA3T and YA4T to generate predecoded signals that each correspond to a particular combination of the received address signals. Such predecoded signals are identified generally as a signal YPRD2, and particularly as predecoded signals Y2N3N4N to Y2T3T4T.

A third predecoder circuit 080 may include signal inverters 081 to 085, decode gates 086 to 093, and output inverters 094 to 101. The various signal inverters (081 to 085) can invert the received address values (YA2T, YA3T and YA4T) and provide them to selected decode gates (086 to 093). In particular, signal inverter 081 can invert address signal YA2T and provide die inverted value to decode gates 086 and 088. Signal inverter 082 can invert address signal YA3T and provide the inverted value to decode gates 086 and 087. Signal inverter 083 can invert address signal YA4T and provide the inverted value to decode gates 086 to 089. Signal inverter 084 can invert address signal YA2T and provide the inverted value to decode gates 090 and 092. Signal inverter 085 can invert address signal YA3T and provide the inverted value to decode gates 090 and 091.

In this arrangement, each decode gate (086 to 093) can receive a different combination of input address values. Thus, for each combination of input address values (YA2T, YA3T and YA4T) the output of one decoding gate (086 to 093) can be activated (driven low in this case). The outputs of decoding gates 086 to 093 may be inverted by output inverters 094 to 101, respectively.

Having described a first, second, and third predecoder circuits (040, 060 and 080) in conjunction with FIGS. 2 to 4, a fourth predecoder circuit 110 will now be described with reference to FIG. 5.

Referring now to FIG. 5, a fourth predecoder circuit 110 may receive address signals YA5T, YA6T and YA7T to generate predecoded signals that each correspond to a particular combination of the received address signals. Such predecoded signals are identified generally as a signal YPRD3, and particularly as predecoded signals Y5N6N7N to Y5T6T7T.

A fourth predecoder circuit 110 may include signal inverters 111 to 115, decode gates 116 to 123, and output inverters 124 to 131. The various signal inverters (111 to 115) can invert the received address values (YA5T, YA6T and YA7T) and provide them to selected decode gates (116 to 123). In particular, signal inverter 111 can invert address signal YA5T and provide the inverted value to decode gates 116 and 118. Signal inverter 112 can invert address signal YA6T and provide the inverted value to decode gates 116 and 117. Signal inverter 113 can invert address signal YA7T and provide the inverted value to decode gates 116 to 119. Signal inverter 114 can invert address signal YA5T and provide the inverted value to decode gates 120 and 122. Signal inverter 115 can invert address signal YA6T and provide the inverted value to decode gates 120 and 121.

In this arrangement, each decode gate (116 to 123) can receive a different combination of input address values. Thus, for each combination of input address values (YA5T, YA6T and YA7T) the output of one decoding gate (116 to 123) can be activated (driven low in this case). The outputs of decoding oates 116 to 123 may be inverted by output inverters 124 to 131, respectively.

Having described the various constituents of a Y predecoder circuit (such as 005 shown in FIGS. 21 to 23), a Y decoder circuit according to one embodiment will now be described with reference to FIGS. 6 and 7. In one particular embodiment, a Y decoder circuit may be used as item 003 as shown in FIGS. 21 to 23.

Figure 6:
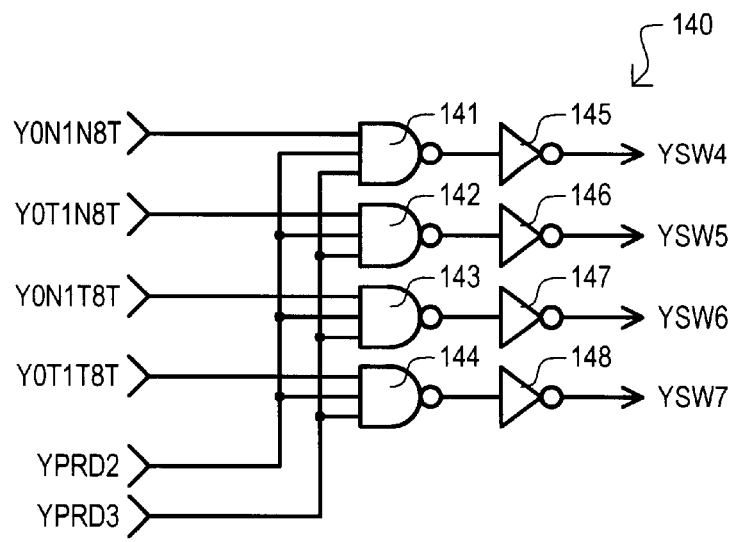
FIG. 6 is a circuit diagram of a first decoder circuit according to one embodiment.
Figure 7:
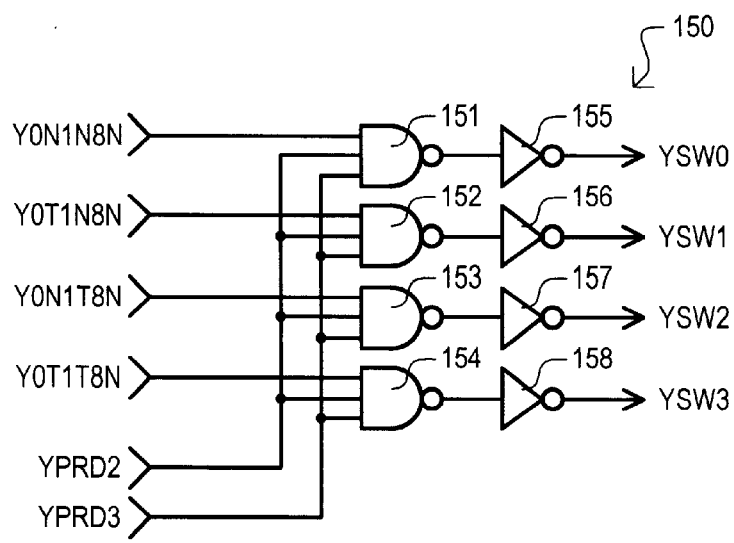
FIG. 7 is a circuit diagram of a second decoder circuit according to one embodiment.

A Y decoder circuit according to one embodiment may include a first decoder circuit 140 as shown in FIG. 6 and a second decoder circuit 150 as shown in FIG. 7.

Referring now to FIG. 6, a first decoder circuit 140 is shown in a circuit diagram. A first decoder circuit 140 may receive predecoded signals Y0N1N8T to Y0T1T8T (from a first predecoder circuit 040 in FIG. 2, for example), a predecoded signal YPRD2 (one of the signals from a third predecoder circuit 080 in FIG. 4), and a predecoded signal YPRD3 (one of the signals from a fourth predecoder circuit 110 in FIG. 5). In response to such predecoded signals, a first decoder circuit 140 may generate Y select signals YSW4 to YSW7.

A first decoder circuit 140 may include decoder gates 141 to 144 and output inverters 145 to 148. Each decoder gate (141 to 144) may have one input that receives a predecoded signal YPRD2 and another input that receives predecoded signal YPRD3. Each decoder gate (141 to 144) may further include a third input that receives one of the predecoded signals Y0N1N8T to Y0T1T8T. In this arrangement, provided predecoded signals YPRD2 and YPRD3 are both high, the output of one decoder oate (141 to 144) can be activated (driven low in this case) when its corresponding predecoded signal Y0N1N8T to Y0T1T8T is activated. The outputs of decoder gates 141 to 144 can be inverted by output inverters 145 to 148 to generate Y select signals YSW0 to YSW3. respectively. Y select signals YSW4 to YSW7 may be used to select one or more ordinary memory cells.

Having described a first decoder circuit 140, a second decoder circuit 150 will now be described with reference to FIG. 7.

Referring now to FIG. 7, a second decoder circuit 150 is shown in a circuit diagram. A second decoder circuit 150 may receive predecoded signals Y0N1N8N to Y0T1T8N (from a second predecoder circuit 060 in FIG. 3, for example), a predecoded signal YPRD2 (one of the signals from a third predecoder circuit 080 in FIG. 4), and a predecoded signal YPRD3 (one of the signals from a fourth predecoder circuit 110 in FIG. 5). In response to such predecoded signals, a second decoder circuit 1150 may generate Y select signals YSW0 to YSW3.

A second decoder circuit 150 may include decoder gates 151 to 154 and output inverters 155 to 158. Each decoder gate (151 to 154) may have one input that receives a predecoded signal YPRD2 and another input that receives predecoded signal YPRD3. Each decoder gate (151 to 154) may further include a third input that receives one of the predecoded signals Y0N1N8N to Y0T1T8N. In this arrangement, provided predecoded signals YPRD2 and YPRD3 are both high, the output of one decoder gate (151 to 154) can be activated (driven low in this case) when its corresponding predecoded signal Y0N1N8N to Y0T1T8N is activated. The outputs of decoder gates 151 to 154 can be inverted by output inverters 155 to 158 to generate Y select signals YSW0 to YSW3, respectively. Y select signals YSW0 to YSW3 may be used to select one or more ordinary memory cells.

Having described the various constituents of a Y predecoder circuit and Y decoder circuit (such as 005 and 007 shown in FIGS. 21 to 23), a redundancy Y switching circuit according to one embodiment will now be described with reference to FIG. 8. In one particular embodiment, a redundancy Y switching circuit may be used as item 004 as shown in FIGS. 21 to 23.

Figure 8:
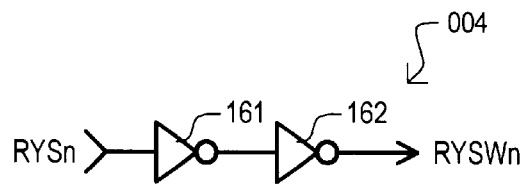
FIG. 8 is a circuit diagram of redundancy Y switching circuit according to one embodiment.

Referring now to FIG. 8, a redundancy Y switching circuit 004 may receive various redundancy Y activating signals RYSn (from redundancy circuits 009 shown in FIG. 1, for example) and generate redundancy Y select signals RYSWn. It is understood that the value "n" in RYSn and RYSWn may represent a range of positive integers (e.g., 0, 1, 2 . . . ).

The redundancy Y switching circuit 004 of FIG. 8 includes two series connected inverters 161 and 162 corresponding to each redundancy Y activating signal RYSn. Thus, when a redundancy Y activating signal RYSn is activated (driven high in this case) a corresponding redundancy Y select signals RYSWn can be activated (also driven high). Each redundancy Y select signals RYSWn may be used to select one or more redundant memory cells.

A semiconductor memory device according to various embodiments has been described. Such a semiconductor memory device can generate a decode enable signal (such YREDB) which can control access between ordinary memory cells and redundant memory cells. In particular, a decode enable signal can deactivate a decoder circuit (such as a Y predecoder circuit 040, 060, 080, 110) when a redundant memory cell is accessed and activate the decoder circuit when an ordinary memory cell is accessed.

Unlike conventional approaches, a semiconductor memory device according to the present invention can minimize the delay involved in accessing an ordinary memory cell when access is switched from a redundant memory cell to the ordinary memory cell. In one embodiment, such a delay is minimized by allowing an enable signal (such as YREDB) to activated in response to a clock synchronization signal (such as YRD). This is in contrast to conventional approaches that may activate an enable signal only according to fuse node levels.

A semiconductor memory device according the present invention may operate as follows. When access is switched from a redundant memory cell to an ordinary memory cell, fuse nodes can be precharged by a clock synchronization signal (such as YRD). Charged fuse nodes can be discharged by the reception of an address signal (such as YAjT). Logic generated by the discharging of fuse nodes can propagate through logic circuits and can eventually result in a decode enable signal (such as YREDB) being activated. However, while such signals are propagating through logic, an ordinary mode pulse may be generated in response to the clock synchronization signal. Such an ordinary mode pulse may activate the decode enable signal before fuse node logic does providing a faster response than conventional approaches.

In this way, a semiconductor memory device may provide improved access speeds when switching from a redundant memory cell access to an ordinary memory cell access. More particularly, by enabling decoder circuits in a faster fashion when switching from a redundant memory cell access to an ordinary cell access, Y select signals (such as YSW) may be generated in as short a time period as when access is switched between two ordinary memory cell accesses.

Having described the structure and various features of particular embodiments, the operation of one embodiment of the present invention will now be described.

In general, the operation of the present invention can be conceptualized as being based on a decision of whether "use" and then "disuse" a redundant memory cell. In particular, a redundancy circuit section (such as 006') can determine what type of access is to take place after receiving an address signal (such as YAjT). When a decision is made to use a redundant memory cell, a redundancy circuit section can deactivate a decode enable signal (such as YREDB). This can deactivate a Y predecoder circuit (such as 005) preventing the generation of predecoded address signals. At the same time, a redundancy circuit section may generate redundancy Y switch activating signal (such as RYS), which can enable a redundancy Y switching circuit (such as 004) to activate a redundancy Y select signal (such as RYSW). An activated redundancy Y select signal can select one or more redundant memory cells.

In contrast, if a decision is made to disuse a redundant memory cell, a decode enable signal (such as YREDB) can be activated, enabling a Y predecoder circuit (such as 005)

to deliver predecoded address signals to a Y decoder circuit (such as 003). In response to predecoded address signals, a Y decoder circuit can activate a Y select signal (such as YSW). An activated Y select signal can select one or more ordinary memory cells.

The above description has indicated that a redundancy circuit section 006' can determine what type of access is to take place after receiving an address signal YAjT. Such a determination operation will now be described with reference to FIG. 1.

Referring now to FIG. 1, it will first be assumed that fuse nodes (FUSE NODE 00–11) are precharged to a high level and an address signal (YA0T to YA8T) corresponds to a defective address. In such an arrangement, fuses 022 and complementary fuses 024 may be selectively opened so as to prevent FUSE NODE 00 from being discharged. As but one particular example, if a defective address includes a high address value YA0T, the fuse 022 connected to the detect transistor 023 that receives address value YA0T can be opened.

Alternatively, it will be assumed that fuse nodes (FUSE NODE 00–11) are precharged to a high level and an address signal (YA0T to YA8T) corresponds to a non-defective address. In such an arrangement, fuses 022 and complementary fuses 024 do not prevent FUSE NODE 00 from being discharged. At least one detect transistor 023 or complementary detect transistor 025 may be turned on by an address value (YA0T to YA8T), or its inverse, and FUSE NODE 00 can be discharged to a second power supply (e.g., ground). As but one particular example, if a defective address includes a high address value YA0T, the fuse 022 connected to the detect transistor 023 that receives address value YA0T can be intact.

The operation of an embodiment will now be described in even more detail with reference to FIGS. 1 to 8 and FIGS. 9A to 9D.

Referring now to FIG. 1, assume that an enable signal ø is low. A low enable signal ø can turn off enable transistor 021, thereby allowing FUSE NODE 00 to be charged. In this way a redundancy circuit 010 can be activated.

A semiconductor memory device can receive an external clock signal CLK. An internal clock signal ICLK can be generated in response to the external clock signal CLK. In one particular example, an internal clock signal ICLK may be generated as a series of high-going one-shot signals generated in response to transitions in the external clock signal CLK. A clock synchronization signal YRD may then be generated in response to the internal clock signal ICLK. In one particular example, a clock synchronization signal YRD may be generated as a series of low-going one-shot signals generated in response to high-going pulses of the internal clock signal CLK.

A semiconductor memory device may then operate in one of a number of different modes. Such modes of operation include switching from an ordinary memory cell access to another ordinary memory cell access, switching from an ordinary memory cell access to a redundant memory cell access, switching from a redundant memory cell access to another redundant memory cell access, and switching from a redundant memory cell access to an ordinary memory cell access.

It is understood that while the below discussion of various modes of operation refers to the particular FUSE NODE 00, the same sorts of responses can occur at other fuse nodes in a redundancy circuit section 006' for different address values.

A mode of switching from an ordinary memory cell access to another ordinary memory cell access according to one embodiment will now be described with reference to FIG. 9A and FIG. 1.

As noted above, an ordinary mode of operation can result in logic combining circuit output YREB being high, a redundant indication signal YRE being low, a decode enable signal YREDB being high, and a redundant Y select signal RYS being low. Further, a Y select signal YSW can result in access to an ordinary memory cell.

In a switching access from one ordinary memory cell to another ordinary memory cell, an internal clock signal ICLK can pulse high. This can result in clock synchronization signal YRD pulsing low. With clock synchronization signal YRD pulsing low, precharge transistor 020 can be turned on, precharging FUSE NODE 00 toward a high precharged level. Further, a high-to-low transition in a clock synchronization signal YRD can result in a one-shot ordinary mode pulse signal YRDB.

The generation of a one-shot ordinary mode pulse signal YRDB could result in a redundant indication signal YRE being forced to an inactive state (low in this example). However, because a previous access was to an ordinary memory cell, a redundant indication signal YRE is already inactive.

An internal clock signal ICLK pulse can then be followed by a change in an address signal YAjT. Because the address signal YAjT corresponds to a non-defective address, FUSE NODE 00 can be discharged by at least one detect transistor 023 or complementary detect transistor 025. It is understood that other fuse nodes within a redundancy circuit section 006' can be likewise discharged. Thus, outputs from combining logic (YREB0 and YREB1) can remain high, generating inactive redundancy indication signals YRE0. It is noted that redundancy indication signal YRE0 would have already been forced low by the ordinary mode pulse signal YRDB. However, once ordinary mode pulse signal YRDB returns low, outputs from combining logic YREB can maintain a corresponding redundancy indication signals YRE0 in an inactive state.

With redundancy indication signals YRE0 to YRE2 all inactive, decode enable signal YREDB can remain active, allowing a second set of Y select signals YSW to be generated to select another ordinary memory cell. It is noted that the timing of the transition from one set of Y select signals YSW to another can be sufficiently spaced apart to have a "low" cross over point, as shown in FIG. 9A. Such a low cross over point can help ensure that two ordinary memory cells corresponding to different addresses are not selected at the same time.

A mode of switching from an ordinary memory cell access to a redundant memory cell access according to one embodiment will now be described with reference to FIG. 9B and FIG. 1.

The initial state of the various signals shown in FIG. 9B can be the same as described with reference to FIG. 9A.

In a switching access from one ordinary memory cell to a redundant memory cell, an internal clock signal ICLK can pulse high. This can result in clock synchronization signal YRD pulsing low. With clock synchronization signal YRD pulsing low, precharge transistor 020 can be turned on, precharging FUSE NODE 00 to a high precharged level. Further, a high-to-low transition in a clock synchronization signal YRD can result in a one-shot ordinary mode pulse signal YRDB.

The generation of a one-shot ordinary mode pulse signal YRDB can result in a redundant indication signal YRE0 initially being forced to remain at the inactive state (low in this example).

An internal clock signal ICLK pulse can then be followed by a change in an address signal YAjT. Because the address signal YAjT corresponds to a defective address, FUSE NODE 00 can remain precharged, as a particular fuse pattern can prevent any of the detect transistors 023 or complementary detect transistors 025 from discharging FUSE NODE 00. Thus, an output from first level combining logic YREB0 can be driven low, forcing redundancy indication signals YRE0 to an active state (high in this case). It is noted that while redundancy indication signal YRE0 could have already been forced low by the ordinary mode pulse signal YRDB, once ordinary mode pulse signal YRDB returns low, outputs from first level combining logic YREB0 and YREB1 can force redundancy indication signal YRE0 to the active state.

With a redundancy indication signals YRE0 active, decode enable signal YREDB can be forced to an inactive state, preventing the generation of Y select signals YSW, and thus preventing the selection of an ordinary memory cell.

Figure 9A:
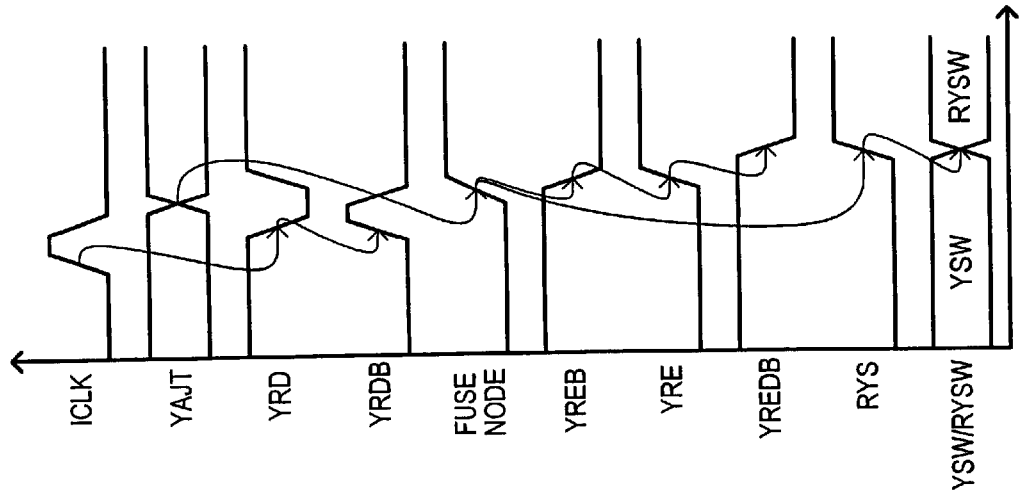
FIGS. 9A to 9D are timing diagrams showing various modes of operation according to one embodiment.
Figure 9B:
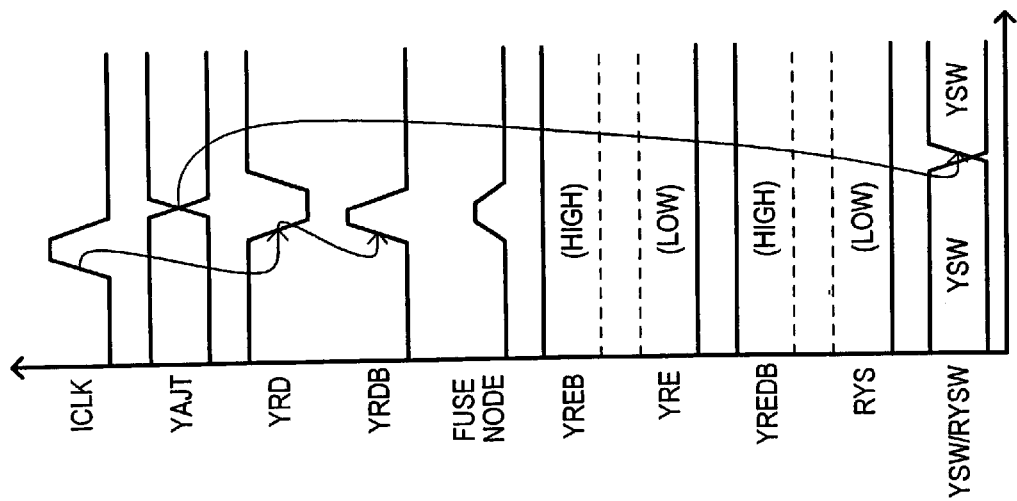

As also shown in FIG. 9B. FUSE NODE 00 can be driven highly, activating a redundant Y select signal RYSW. It is noted that the generation of a redundant Y select signal RYSW typically includes fewer and/or faster circuit elements. Consequently, a redundant Y select signal RYSW may be activated faster than ordinary Y select signals YSW. Thus, it may be possible to have a higher cross over point than the case of FIG. 9A.

It is understood that if it is desired to make a switch over time of Y select signals for the case of FIG. 9B, to be equal to that in FIG. 9A, the number of buffer stages used to generate redundant Y select signals YSW could be increased.

A mode of switching from a redundant memory cell access to an ordinary memory cell access according to one embodiment will now be described with reference to FIG. 9C and FIG. 1.

The initial state of the various signals shown in FIG. 9B can be the same as described with reference to FIG. 9C. Namely, that FUSE NODE 00 can be at a high level, outputs from combining logic YREB can be at a low level, redundant indication signal YRE can be active (high), decode enable signal YREDB can be inactive (low), redundancy select signal RYS can be active (high), and redundancy Y select signals (RYSW) can select a redundant memory cell.

In switching access from a redundant memory cell to an ordinary memory cell, an internal clock signal ICLK can pulse high. This can result in clock synchronization signal YRD pulsing low. With clock synchronization signal YRD pulsing low, precharge transistor 020 can be turned on. However, because a previous address corresponded to a defective address, FUSE NODE 00 can already be high.

A high-to-low transition in a clock synchronization signal YRD can result in a one-shot ordinary mode pulse signal YRDB. The one-shot ordinary mode pulse signal YRDB can result in a redundant indication signal YRE0 being forced to the inactive state (low). Note this is in contrast to a conventional approach in which fuse node levels would have to propagate through various stages of logic to force a redundancy indication signal YRE0 low. Thus, a redundant indication signal YRE0 can be deactivated faster than in a conventional approach.

An internal clock signal ICLK pulse can then be followed by a change in an address signal YAjT. Because the address signal YAjT corresponds to a non-defective address, FUSE NODE 00 can be discharged by at least one detect transistor 023 or complementary detect transistor 025. It is understood that other fuse nodes within a redundancy circuit section 006' can be likewise discharged. Thus, outputs from first level combining logic YREB0 and YREB1 can be forced high, which can force a redundancy indication signal YRE0 to an inactive state. However, as noted above, the redundancy indication signal YRE0 would have already been forced low by the ordinary mode pulse signal YRDB. However, once ordinary mode pulse signal YRDB returns low, outputs from combining logic YREB0 and YREB1 can maintain a corresponding redundancy indication signals YRE0 in an inactive state. Thus, the duration of an ordinary mode pulse signal YRDB should have a sufficient duration to keep a redundancy indication signal YRE0 inactive long enough to allow the discharged fuse node levels to propagate through combining logic and maintain a redundancy indication signal YRE0 at the inactive level.

With a redundancy indication signal YRE0 inactive, a decode enable signal YREDB can be activated, resulting in the generation of Y select signals YSW which can then select ordinary memory cells. In this way, by utilizing an ordinary mode pulse signal YRDB, switching from a redundant memory cell access to an ordinary memory cell access may be as fast as switching between two ordinary memory cell accesses.

Figure 9D:
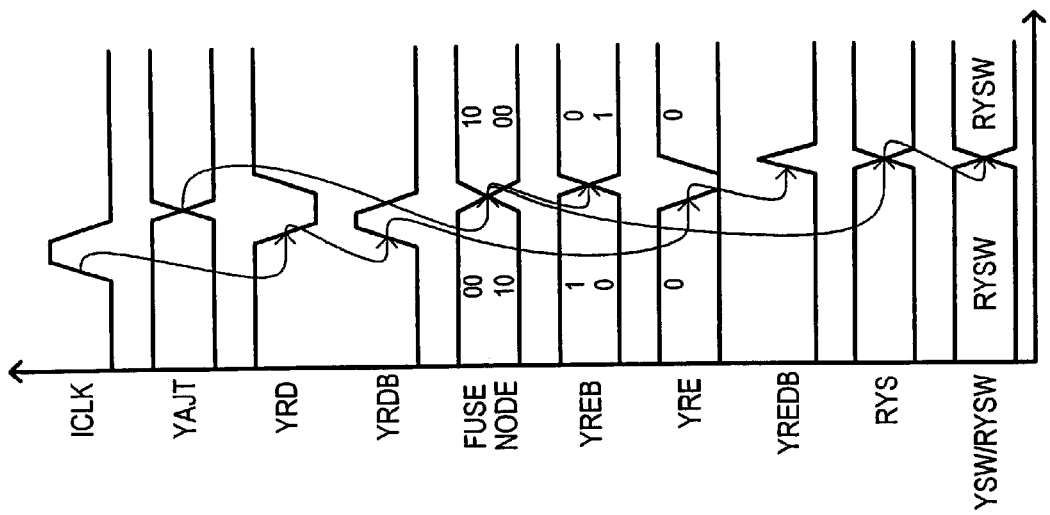
Figure 9C:
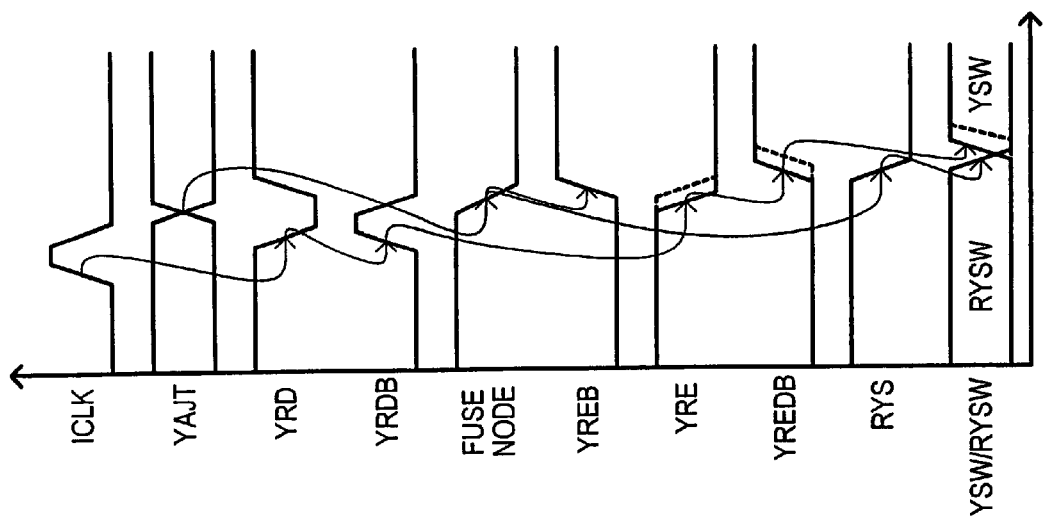

It is noted that FIG. 9C includes a dashed line that indicates a conventional approach. As shown, a conventional approach may take longer than the approach of the present invention.

A mode of switching from a redundant memory cell access to another redundant memory cell access according to one embodiment will now be described with reference to FIG. 9D and FIG. 1.

The initial state of the various signals shown in FIG. 9B can be the same as the initial states of FIG. 9C. Namely, that FUSE NODE 00 can be at a high level, outputs from combining logic YREB can be at a low level, redundant indication signal YRE can be active (high), decode enable signal YREDB can be inactive (low), redundancy select signal RYS can be active (high), and redundancy Y select signals can select a redundant memory cell.

In a switching access from a redundant memory cell to an ordinary memory cell, an internal clock signal ICLK can pulse high. This can result in clock synchronization signal YRD pulsing low. With clock synchronization signal YRD pulsing low, precharge transistor 020 can be turned on. However, because a previous address corresponded to a defective address, FUSE NODE 00 can already be high.

It will be assumed for the purposes of this description that an initial redundancy access corresponds to FUSE NODE 00 and a subsequent redundancy access corresponds to FUSE NODE 10.

A high-to-low transition in a clock synchronization signal YRD can result in a one-shot ordinary mode pulse signal YRDB. The one-shot ordinary mode pulse signal YRDB can result in the redundant indication signal YRE0 corresponding to FUSE NODE 00 and FUSE NODE 01 being forced to the inactive state (low). However, because a second redundant access is going to take place, this state is only temporary, as fuse node logic states will return the redundant indication signal YRE0 to an active level (high).

An internal clock signal ICLK pulse can then be followed by a change in an address signal YAjT. Because the address signal YAjT corresponds to a defective address programmed for FUSE NODE 10, FUSE NODE 10 can remain at a precharged level. However, because the defective address is different from that stored for FUSE NODE 00, FUSE NODE 00 can be discharged by at least one detect transistor 023 or complementary detect transistor 025. Thus, FIG. 9D shows a fuse node waveform 00, corresponding to FUSE NODE 00, transitioning low, while a fuse node waveform 10, corresponding to FUSE NODE 10 transitions high.

Such transition in fuse node values can then begin propagating through combining logic. In particular, a combining logic output YREB0 corresponding to FUSE NODE 00 and FUSE NODE 01 can transition from low to high. This is shown as combining logic output waveform 0. However, because FUSE NODE 10 is high, a combining logic output YREB1 corresponding to FUSE NODE 10 and FUSE NODE 11 can transition from high to low. This is shown as combining logic output waveform 1.

As noted above, an ordinary mode pulse signal YRDB can force a redundancy indication signal YRE0 to an inactive state. However, eventually the high combining logic output (YREB1) will force redundancy indication signal YRE0 to return to an active state. This is shown in FIG. 9D by the temporary low level of the redundancy indication signal waveform 0.

The resulting low pulse of redundancy indication signal YRE0 can result in a decode enable signal YREDB high pulse, as also shown in FIG. 9D. It is noted that if the duration of a decode enable signal YREDB pulse is too long, Y select signals for an unintended ordinary memory cell may be activated. Accordingly, while an ordinary mode pulse signal YRDB pulse duration should be long enough to allow fuse node levels to propagate through combining logic, such a pulse duration should also be short enough to prevent erroneous selection of an ordinary memory cell.

Figure 10:
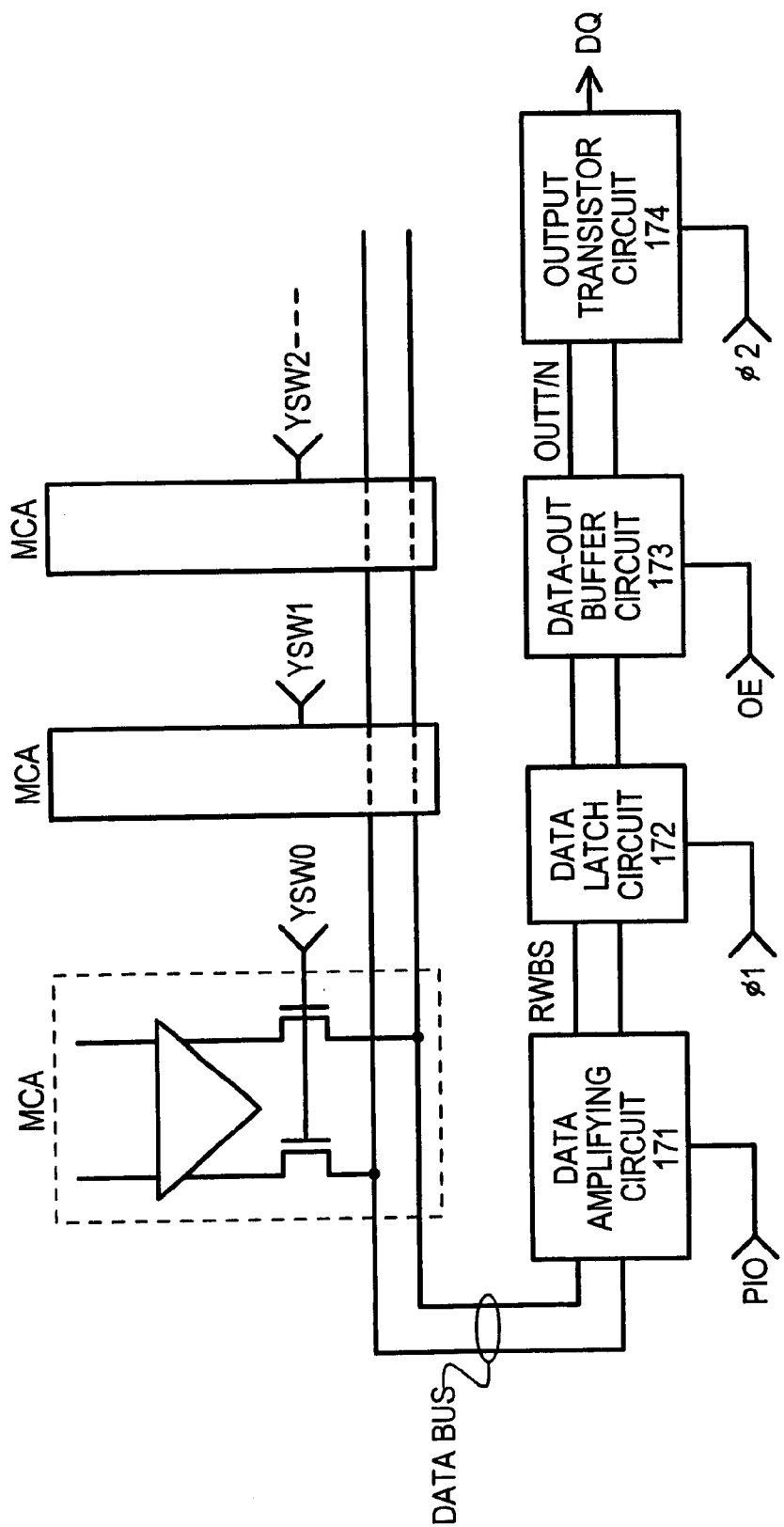
FIG. 10 is a block diagram showing a data access path according to one embodiment.

Referring now to FIG. 10, a data access path of a semiconductor memory device according to one embodiment will now be described. As shown in FIG. 10, memory cell data from a memory cell array (MCA) can be placed on a data bus DATA BUS. Such data may have a relatively small potential with respect to normal swing logic signals. Such small data values may be provided to data amplifying circuit 171. Data amplifying circuit 171 may then be activated by a control signal PIO, thereby amplifying the relatively small data values. An output of a data amplifying circuit 171 can be placed on a read/write bus RWBS.

Amplified data signals can be provided to a data latch circuit 172. A data latch circuit 172 may latch and output received data signals according to a latch clock ø1. Latched data values may then propagate through a data-out buffer circuit 173. A data-out buffer circuit 173 can place output data on output lines OUTT/N. Output lines OUTT/N can be received by an output transistor circuit 174. A data-out buffer circuit 173 can be enabled according to an output enable signal OE. An output transistor circuit 174 may operate according to an output clock ø2. The resulting output data provided by output transistor circuit 174 is provided on data output node DQ.

It is understood that both ordinary memory cell data and redundant memory cell data may be placed on DATA BUS, and subsequently amplified and output on data output node DQ.

An important feature of a semiconductor memory device can be its access time. An access time can be defined as the length of time between a transition in an external clock signal CLK and resulting valid data at a data output node. An access time is often represented by the symbol "tAA."

In the arrangement of FIG. 10, a latch clock ø1 and output clock ø2 can be activated according to a desired column address strobe signal (CAS) latency value. As is well known, a CAS latency can be the time between the entry of a read command to a semiconductor memory device and the availability of data at an output.

Figure 11:
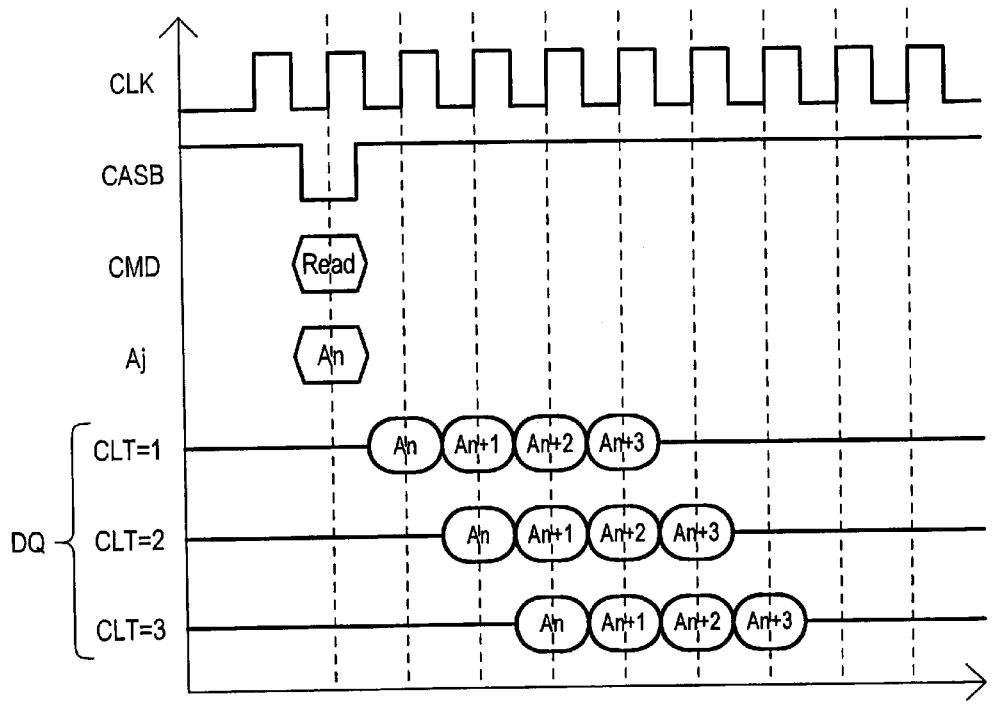
FIG. 11 is a timing diagram illustrating read operations of differing CAS latencies.

Referring now to FIG. 11, a timing diagram is set forth illustrating read operations of varying latency. As shown in FIG. 11, on a rising edge of an external clock signal CLK, a column address strobe signal CASB can be active (low in this case). As shown by the command and address waveforms CMD and ADD, a read command and read address may be entered at this time. The entry of a read command may include placing other input signals (not shown) at predetermined levels.

FIG. 11 also includes waveforms DQ that show three different responses according to CAS latencies (CLT) of 1, 2 and 3. Further each read operation has a burst length of 4, thus, in response to the application of a single read command and address, four data values from a sequence of four addresses are output. In the particular examples shown, burst access is according to a consecutive sequence, thus the four data values are shown to correspond to address values An, An+1, An+2 and An+3.

The operation having a CAS latency of 1 (CLT=1) illustrates how data value corresponding to address An is available one clock cycle following the entry of a read command. The remaining data values are available on each subsequent clock cycle. Similarly, for a CAS latency of 2 (CLT=2) burst data will start to be available two cycles following the entry of a read command. Burst data is available three cycles after a read command for a CAS latency of 3 (CLK=3).

Referring back to FIG. 10, various access path control signals may be used to control latency. As but one example if a CAS latency of two is desired output clock ø2 can be synchronous with an external clock signal CLK. That is, data can flow through from DATA BUS to output transistor circuit 174, and then be output by output transistor circuit 174 on the next clock cycle. If a CAS latency of three is desired both a latch clock ø1 and an output clock ø2 can be synchronous with an external clock signal CLK. That is, data can flow through from DATA BUS to data latch circuit 172 and be output on a second clock cycle to output transistor circuit 174. Output transistor circuit 174 may then output the received data on a third clock cycle.

Because increases in semiconductor memory operation speed are desirable, smaller access times tAA are desired. Smaller tAA times may be advantageous in burst modes of operation, as a tAA value limit how fast data may be provided in a burst access. This, improvements in access times tAA can improve cycle time as the overall time period involved for CAS latencies of 2 and 3 may also become smaller. Consequently, in the development of semiconductor memory devices, a continuing goal is that of minimizing access times tAA.

Referring now to FIG. 10 in conjunction with FIG. 12, the generation of various timing and control signals of an access path will now be described.

As noted above, a control signal PIO can be supplied to a data amplifying circuit 171 to amplify relatively small data values placed on DATA BUS. In one arrangement, a control signal PIO may be generated in response to clock synchronization signal YRD. More particularly, a control signal PIO may be generated by phase shifting a clock synchronization signal YRD. However, in order to ensure a sufficient data value signal has been generated on DATA BUS before amplification begins, a control signal PIO must be activated a certain time period after Y select signals (YSW) or redundancy Y select signals (RYSW) are activated.

Consequently, a control signal PIO can be shifted to be activated a certain time period after a crossover in Y select and/or redundancy Y select signals (YSW or RYSW).

Figure 12:
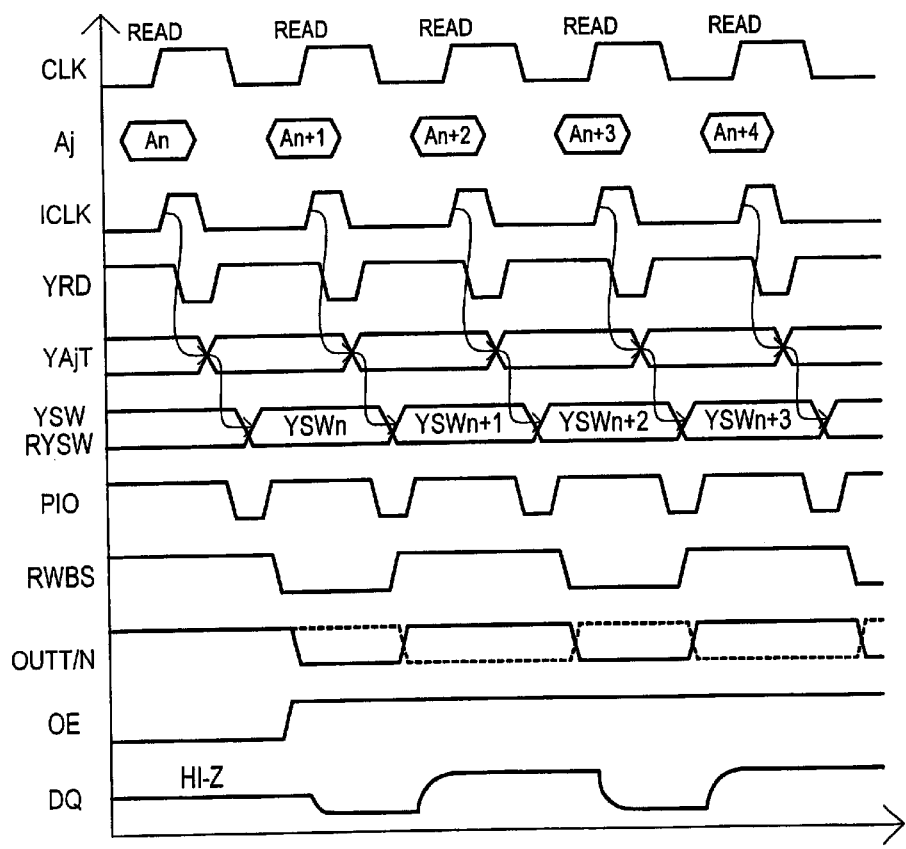
FIG. 12 is a timing diagram illustrating various timing and control signals according to one embodiment.

If reference is made to FIG. 12, a particular data pattern is shown to be provided on read/write bus RWBS. That is, output data can be low, high, low and then high again. This output data may then be placed on output lines OUTT/N on particular clock cycles according to a selected CAS latency value. For a CAS latency value of 1 or 2, output lines OUTT/N may respond as shown by a solid line in FIG. 12. For a CAS latency of 3, a data latch circuit 172 may delay data by an additional clock cycle, thus, output lines OUTT/N may respond as shown by a dashed line in FIG. 12.

FIG. 12 also shows the response of an output enable signal OE. An output enable signal may be activated (transition high) to thereby enable a data-out buffer circuit 173.

Referring now to FIG. 13, the differences between an access according one embodiment and a conventional approach will now be described. FIG. 13 particularly shows the generation of various signals when switching from redundant cell access to an ordinary cell access. As shown in FIG. 12, data may be available at a data output node a predetermined time following a transition in the control signal PIO. In FIG. 13, this value is equal to 4.2 ns and can be independent of any particular address signal. A total access time can be about 12 to 13 ns. Consequently, about two thirds of an access time occurs between the activation of an external clock signal CLK and the generation of Y select signals YSW. Thus, reducing the time involved in generating Y select signals can speed up an access time tAA.

As shown in FIG. 13, in a conventional switch between a redundant memory cell access and an ordinary memory cell, the generation of Y select signals YSW may take as long as 8.5 ns. Thus, if a control signal PIO is generated according to the timing noted above, Y select signals YSW may be generated after such a control signal PIO. Such a delay may result for the reasons described above. Namely, that in a conventional ordinary memory cell access, Y select signals YSW may be generated in response to a change in address (that may discharge a fuse node) that propagates through various logic stages. In contrast, in a redundant memory cell access, redundant Y select signals RYSW may be generated in response to a change in address (that may charge a fuse node) that propagates through a two-stage buffer stage. The latter case can be faster than the former.

As also shown in FIG. 13, if Y select signals YSW are generated after a control signal, such a delay may produce erroneous results. Consequently, it may be necessary to shift a control signal PIO, and all subsequently generated signals with a corresponding delay. Such a shifting is shown in FIG. 13 by corrected values indicated by arrows. As the corrected values show, delays may increase an overall access time tAA to 13.5 ns. This is in contrast to the illustrated embodiment, which call provide an access time of 12.1 ns.

A preferred embodiment response may generate a decode enable signal YREDB in 5.4 ns, this is faster than the conventional case which takes 6.8 ns. Still further, the faster activation YREDB can allow all subsequent control signals to be generated sooner than the conventional case. In this way, an embodiment may improve all access time tAA when switching from a redundant memory cell access to an ordinary memory cell access from 13.5 ns to 12.1 ns.

Referring now to FIGS. 14 to 19, a number of simulation waveforms are shown that compare switching access operations of a conventional device with one embodiment of the present invention.

Figure 14:
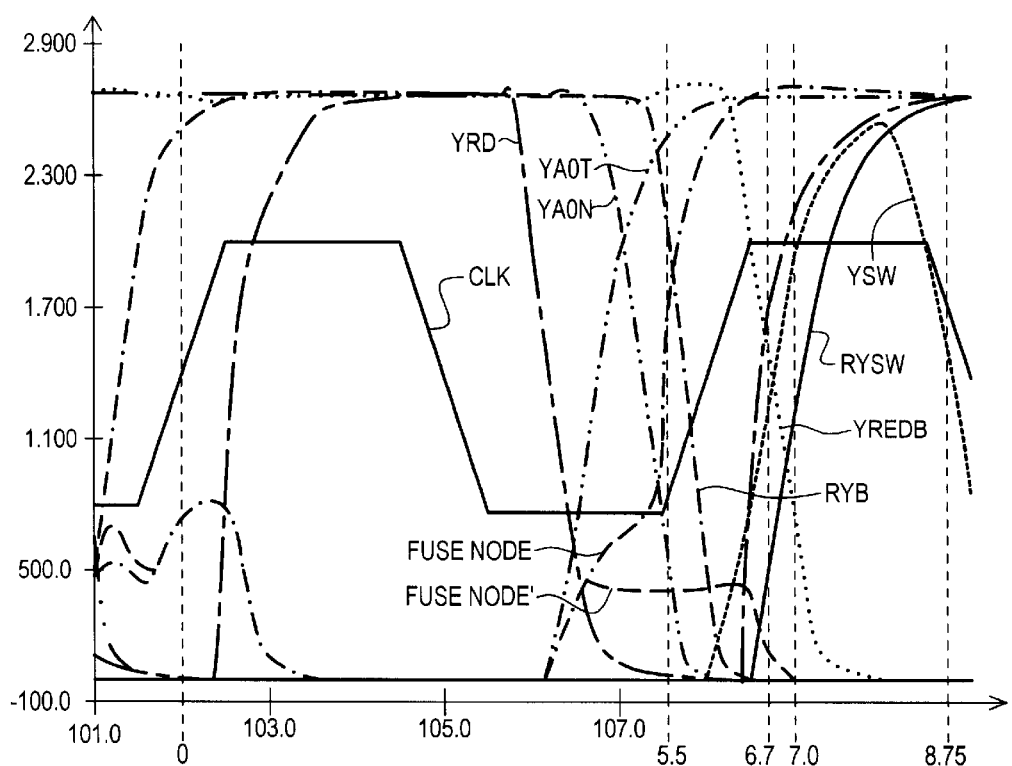
FIG. 14 is a timing diagram showing a switching from an ordinary memory cell access to a redundant memory cell access according to a conventional device.
Figure 15:
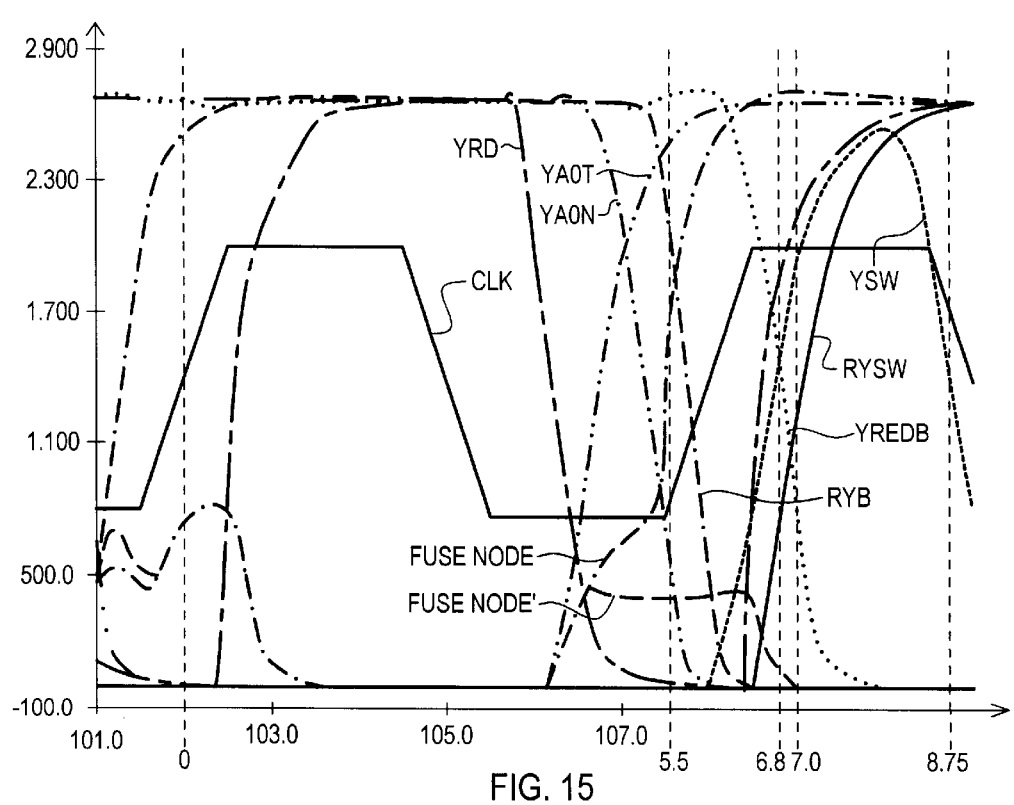
FIG. 15 is a timing diagram showing a switching from an ordinary memory cell access to a redundant memory cell access according to one embodiment.

FIGS. 14 and 15 show two examples of various signals that can be generated when switching from an ordinary memory cell access to a redundant memory cell access. FIGS. 14 and 15 show an external clock signal CLK, a first address value YA0T, a second address value YA0N, which is an inverse signal of the first address value, a clock synchronization signal YRD, a first fuse node response FUSE NODE, a second fuse node response FUSE NODE', a fuse node latch output RYB, a decode enable pulse YREDB, a redundancy Y select signal RYSW, and a Y select signal YSW. FIG. 14 shows a conventional response and FIG. 15 shows the response according to one embodiment.

In the examples shown, switching from an ordinary memory cell address to a redundant memory cell address can result in a first address value YA0T transitioning from low to high and a second address value YA0N transitioning from high to low. Similarly, the switching of address can result in first fuse node FUSE NODE going high while second fuse node FUSE NODE' is discharged. It is noted that while a Y select signal YSW does transition high, the signal then returns low, which can prevent an ordinary memory cell from being accessed.

A comparison between FIGS. 14 and 15 shows that the conventional device and present invention can provide essentially the same access time when switching from an ordinary memory cell access to a redundant memory cell access. More particularly, in both FIGS. 14 and 15, a redundancy Y select signal RYSW can be activated (transition high in this example) about 7.0 ns following a low-to-high transition in an external clock signal CLK.

Figure 16:
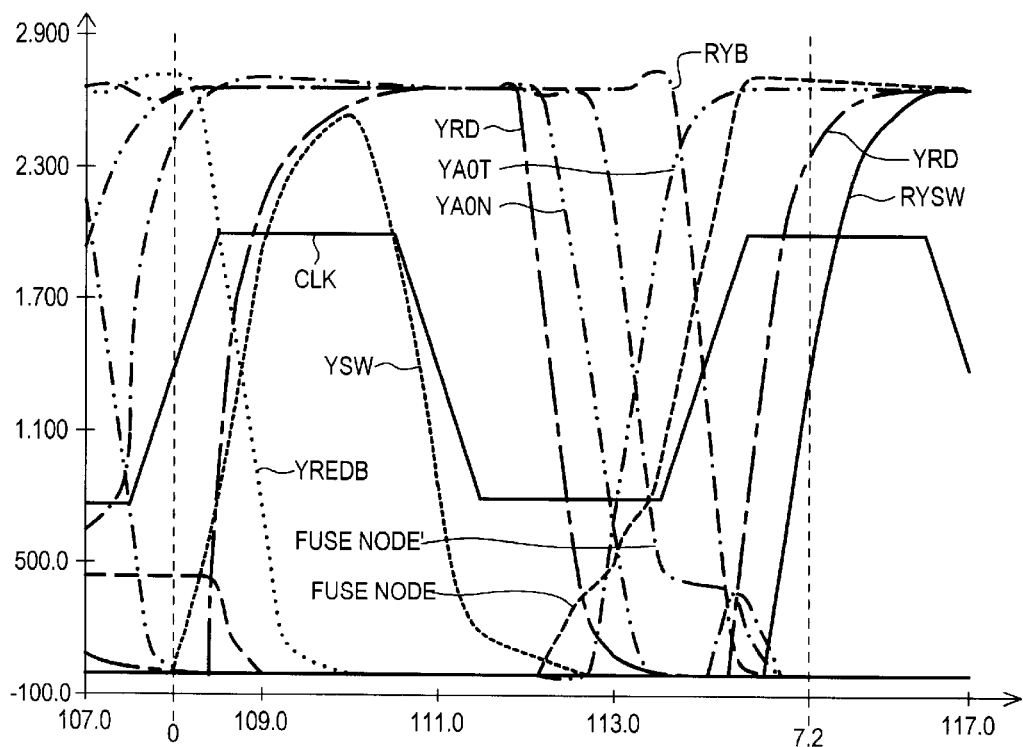
FIG. 16 is a timing diagram showing a switching from a redundant memory cell access to another redundant memory cell access according to a conventional device.
Figure 17:
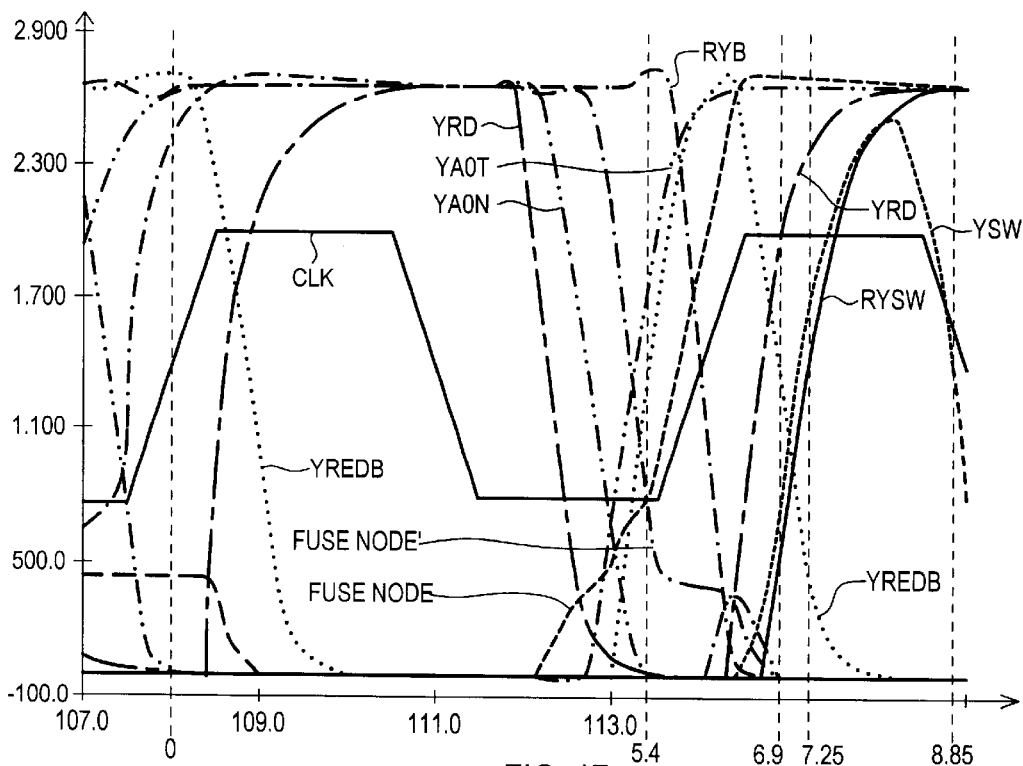
FIG. 17 is a timing diagram showing a switching from a redundant memory cell access to another redundant memory cell access according to one embodiment.

FIGS. 16 and 17 show two examples of various signals that can be generated when switching from one redundant memory cell access to another redundant memory cell access. FIGS. 16 and 17 include the same essential signals as 14 and 15. FIG. 16 shows a conventional response and FIG. 17 shows the response according to one embodiment.

In a similar fashion to FIGS. 14 and 15, in FIGS. 16 and 17, switching from a one redundant memory cell address to another can result in a first address value YA0T transitioning from low to high and a second address value YA0N transitioning from high to low. In addition, the switching of addresses can result in first fuse node FUSE NODE going high while second fuse node FUSE NODE' is discharged. It is noted that in FIG. 17, a decode enable signal YREDB can make a temporary transition high. This result can cause a similar response in a Y select signal. However, while a Y select signal YSW does transition high, the signal then returns low, which can prevent an ordinary memory cell from being accessed.

A comparison between FIGS. 16 and 17 shows that the conventional device and present invention can provide essentially the same access time when switching from one redundant memory cell access to another redundancy memory cell access. More particularly, in FIG. 16 a redundancy Y select signal RYSW can be activated (transition high in this example) about 7.2 ns following a low-to-high transition in an external clock signal CLK, while the same access time may take about 7.25 ns in one embodiment of the present invention.

Figure 18:
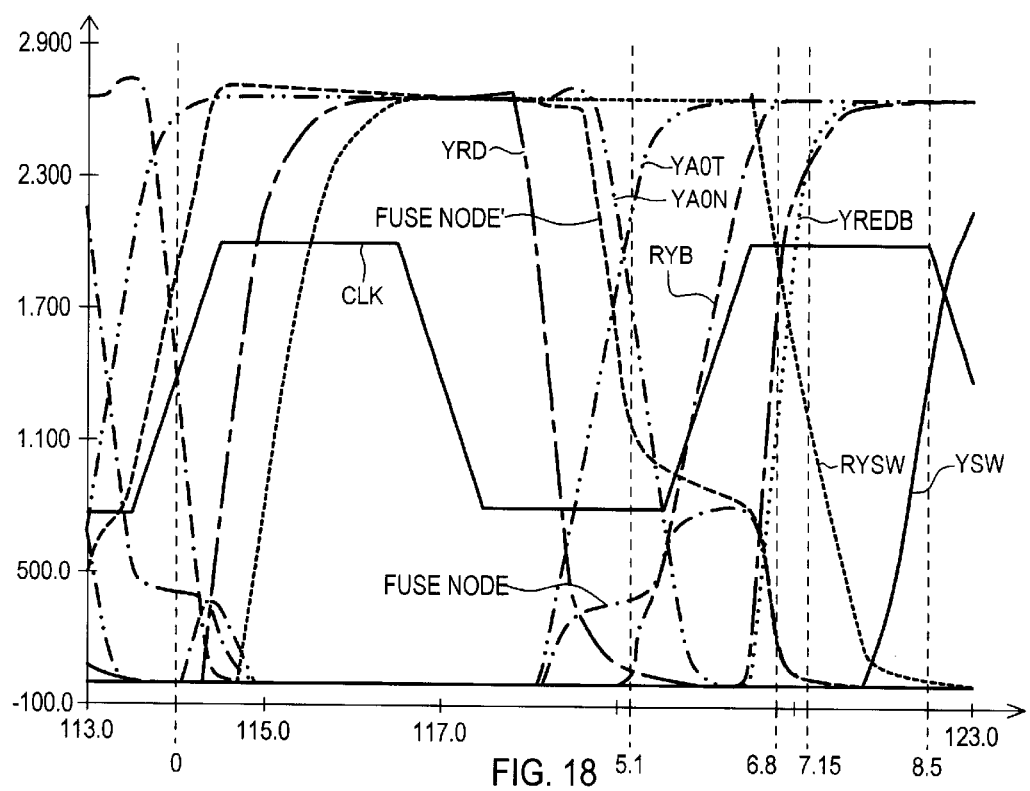
FIG. 18 is a timing diagram showing a switching from a redundant memory cell access to an ordinary memory cell access according to a conventional device.
Figure 19:
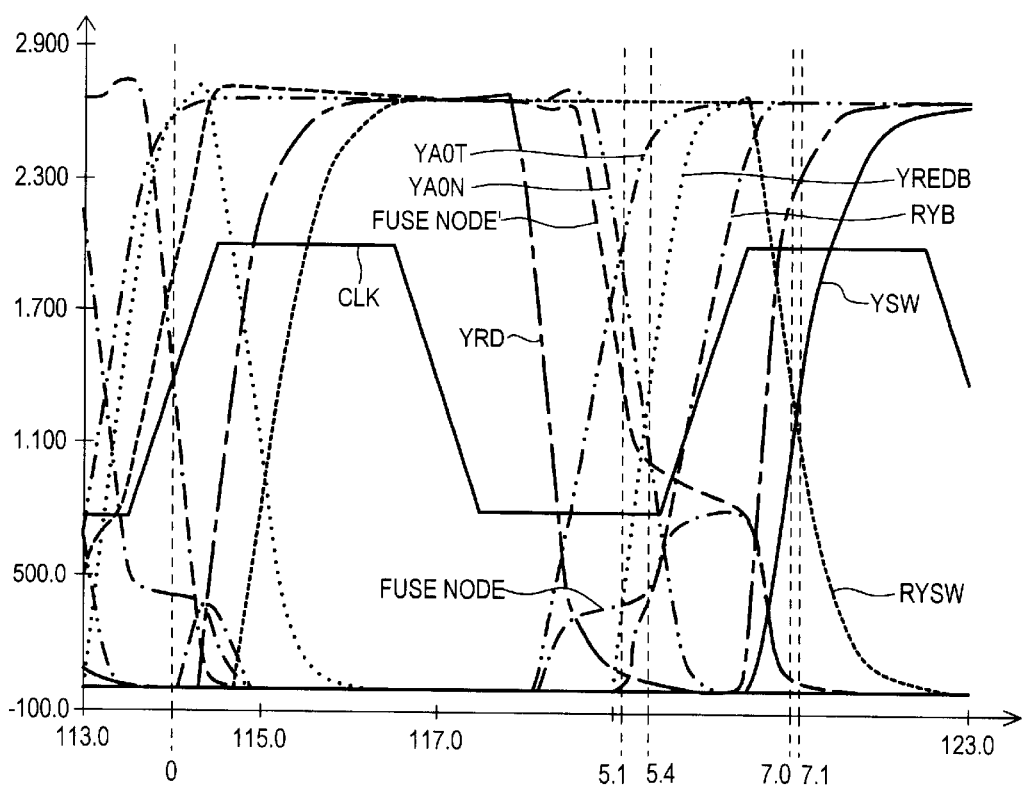
FIG. 19 is a timing diagram showing a switching from a redundant memory cell access to an ordinary memory cell access according to one embodiment.

FIGS. 18 and 19 show two examples of various signals that can be generated when switching from a redundant memory cell access to an ordinary memory cell access. FIGS. 18 and 19 include the same essential signals as 14 and 15. FIG. 18 shows a conventional response and FIG. 19 shows the response according to one embodiment.

In a similar fashion to FIGS. 14/15 and FIGS. 16/17, switching from a redundant memory cell address to an ordinary memory cell address can result in a first address value YA0T transitioning from low to high and a second address value YA0N transitioning from high to low. In addition, a first fuse node FUSE NODE can being going high while second fuse node FUSE NODE' is discharged. However, because an ordinary memory cell is accessed, both FUSE NODE and FUSE NODE' waveforms are both eventually low.

A comparison between FIGS. 18 and 19 shows that tie conventional device and present invention can differ significantly from that of the present invention. More particularly, according to the embodiment shown, a decode enable signal YREDB can transition from low to high in about 5.4 ns. This is in contrast to a conventional approach that may take about 6.8 ns. In other words, activation of a decode enable signal YREDB according the present invention may be about 1.4 ns faster than the conventional case. This difference in speed is carried through to the selection of an ordinary memory cell. In particular, a Y select signal YSW may activated in about 7.1 ns according to the embodiment illustrated. The same operation may take about 8.5 ns in the conventional case.

As has been described above, according to the present invention, a decode activation signal YREDB may be activated without regard to changes in fuse node levels. Thus, predecoder circuits can be activated faster, allowing Y select signals to access ordinary memory cells. According to some embodiments, switching from a redundant memory cell access to an ordinary memory cell access may be as quick as switching between two ordinary memory cell accesses.

In such an arrangement, the activation of Y select signals can be determined by the switching of address signals, as decoding circuit can be enabled faster. These improvements in speed can allow the speed of various stages in an access path to likewise be increased, allowing improved access times and/or operating margins.

If reference is made back to FIG. 10, in cases where a CAS latency is equal to 2, such improvements in speed can allow an output clock ø1 to operate more rapidly than conventional approaches. Similarly, where a CAS latency is equal to 3, such improvements in speed can allow an output clock ø1 and latch clock ø2 to operate more rapidly than conventional approaches.

In this way various access times may be improved over a conventional semiconductor memory device.

Having described various embodiments in detail, one alternate embodiment of the present invention will now be described with reference to FIG. 20. A semiconductor memory device according to an alternate embodiment may have the same general configuration as that shown in FIGS. 21 to 23. However, such an embodiment may include a redundancy circuit section 012 that differs from that of FIG. 1. Accordingly, a redundancy circuit section 012 according to an alternate embodiment will now be described in detail.

Figure 20:
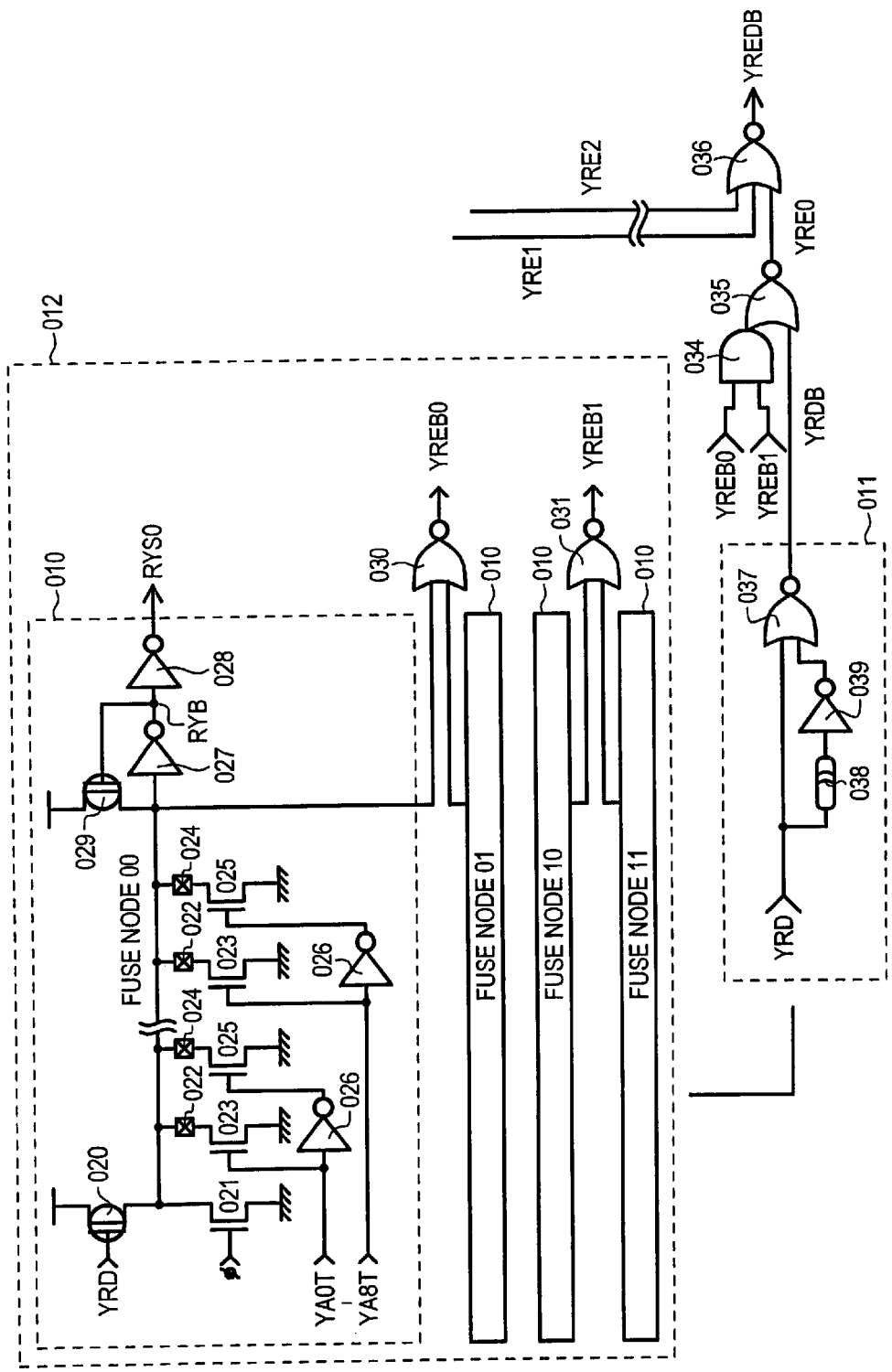
FIG. 20 is a block diagram of a redundancy circuit section according to one alternate embodiment.

Referring now to FIG. 20, in an alternate embodiment, logic circuits for generating a decode enable signal YREDB can be particularly situated in close proximity to Y predecoder circuits. In addition or alternatively, a pulse generator 011 can be situated in close proximity to Y predecoder circuits.

In an arrangement such as that shown in FIG. 1, redundancy circuits 010 may contain a large number of fuses and it may be difficult to place logic circuits and/or a pulse generator 011 close by. In addition, because a redundancy circuit section can be situated further from a memory cell array than Y predecoder circuits a signal line that carries a decode enable signal YREDB may be longer than those carrying other signals described.

A relatively long enable signal YREDB line may have a higher inherent capacitance. This can slow transitions between logic states. If a capacitance is sufficiently large, it may cancel out advantages obtained by activating an enable signal YREDB as previously described.

To address such a potential drawback, logic circuits 034, 035, 036 and a pulse generator 011 may be situated in close proximity to Y predecoder circuits. This can lessen the distance that a decode enable signal YREDB can travel. However, such an arrangement may increase the distance that must be traveled by combining logic output signals, such YREB0 and YREB1. Thus, placement and/or size of first level combining circuits (30 and 31) with respect to second level combining circuits (034, 035, 036) can be optimized to generate the best YREDB response.

Various embodiments of a semiconductor memory device have been described that may improve access times over conventional semiconductor memory devices. More particularly, switching from a redundant memory cell access to an ordinary memory cell access can be essentially as fast as switching between two ordinary memory cell accesses. In one particular embodiment, such improvements can be accomplished by generating an ordinary mode pulse signal YRDB in response to a phase shifted timing clock.

Even more particularly embodiments have been described that include fuse nodes that may be charged in a redundant memory cell access and discharged in an ordinary memory cell access. However, the initial activation of decoder circuits does not have to depend on the state of such fuse nodes. This can allow for a faster response than conventional approaches.

The above improvements in operation can allow the operation of decoder circuits to depend upon the timing of address signals, and not fuse node levels. Such improvements in speed may allow data access path circuits to operate faster. If such data access path circuits are clocked stages, such circuits can operate at a faster clock speed, thereby improving cycle time of the present invention.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a plurality of ordinary memory cells;
   a plurality of redundant memory cells; and
   a decoder circuit section that accesses ordinary memory cells in response to an address signal received in synchronism with a clock signal, the decoder circuit section being enabled by an active decoder enable signal when ordinary memory cells are accessed, the decoder circuit section being disabled by an inactive decoder enable signal when redundant memory cells are accessed, the decoder enable signal being activated in synchronism with the clock signal when access is switched from a redundant memory cell to an ordinary memory cell.

2. The semiconductor memory device of claim 1, wherein:
   the decoder circuit section includes decoders and at least one predecoder circuit that prevents the address signal from reaching the decoder circuits when the decoder circuit section is disabled.

3. The semiconductor memory device of claim 1, further including:
   a plurality of state holding circuits, at least one state holding circuit being active when the address signal accesses a redundant memory cell and inactive when the address signal accesses an ordinary memory cell; and
   a logic circuit that activates the decoder enable signal when all the state holding, circuits are inactive and deactivates the decoder enable signal when any one of the state holding circuits is active.

4. The semiconductor memory device of claim 1, wherein:
   a logic circuit includes
      a plurality of first level gates that logically combine output signals of at least two state holding circuits.
      at least one second level gate that logically combines the outputs of first level gates with an ordinary mode signal, and
      a pulse signal generator that activates the ordinary mode signal in synchronism with the clock signal.

5. The semiconductor memory device of claim 4, wherein:
   the first level gates include NOR logic oates, and
   the at least one second level gate includes an AND gate for combining first level gate outputs and a NOR gate for combining the output of the AND gate with the ordinary mode signal.

6. The semiconductor memory device of claim 4, wherein:
   the pulse signal generator includes a pulse generator logic gate having one input coupled to a clock synchronization signal directly and another input that receives the clock synchronization signal by way of a delay circuit, the clock synchronization signal being synchronous with the clock signal.

7. A synchronous semiconductor memory device, comprising:
   a plurality of ordinary memory cells that are accessed in an ordinary mode when an enable signal is active;
   a plurality of redundant memory cells that are accessed in a redundant mode when an enable signal is inactive; and
   a redundancy circuit section that switches the enable signal from an inactive state to an active state in synchronism with an externally applied clock signal when an ordinary memory cell is accessed.

8. The synchronous semiconductor memory device of claim 7, wherein:
   the redundancy circuit section switches the enable signal from an active state to an inactive state in response to address values received in synchronism with the clock signal when a redundant memory cell is accessed after an ordinary memory cell is accessed.

9. The synchronous semiconductor memory device of claim 7, wherein:
   the redundancy circuit section includes a fuse node that can be set to a first state and changed to a second state when an ordinary memory cell is accessed.

10. The synchronous semiconductor memory device of claim 9, wherein:
    the fuse node can be set to the first state in synchronism with the external clock signal.

11. The synchronous semiconductor memory device of claim 7, wherein:
    the redundancy circuit section includes a fuse node that can be set to a first state and maintained in the first state when a redundant memory cell is accessed.

12. The synchronous semiconductor memory device of claim 11, wherein:
    the redundancy circuit section includes a plurality of fuse nodes and a combining circuit that switches the enable signal from an inactive state to an active state when one fuse node is in the first state or an ordinary mode pulse is generated in synchronism with the clock signal.

13. The synchronous semiconductor memory device of claim 7, wherein:
    the redundancy circuit section includes a pulse generator circuit that generates an ordinary mode pulse in synchronism with the clock signal, the redundancy circuit section switching the enable signal from an inactive state to an active state in response to the ordinary mode pulse.

* * * * *